(12) United States Patent
Sharma et al.

(10) Patent No.: US 12,191,395 B2
(45) Date of Patent: Jan. 7, 2025

(54) DUAL GATE CONTROL FOR TRENCH SHAPED THIN FILM TRANSISTORS

(71) Applicant: Intel Corporation, Santa Clara, CA (US)

(72) Inventors: Abhishek A. Sharma, Hillsboro, OR (US); Van H. Le, Beaverton, OR (US); Gilbert Dewey, Hillsboro, OR (US); Jack T. Kavalieros, Portland, OR (US); Shriram Shivaraman, Hillsboro, OR (US); Benjamin Chu-Kung, Portland, OR (US); Yih Wang, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/494,384

(22) Filed: Oct. 25, 2023

(65) Prior Publication Data
US 2024/0055531 A1 Feb. 15, 2024

Related U.S. Application Data

(60) Division of application No. 17/492,487, filed on Oct. 1, 2021, now Pat. No. 11,862,728, which is a
(Continued)

(51) Int. Cl.
*H01L 29/786* (2006.01)
*H01L 21/02* (2006.01)
(Continued)

(52) U.S. Cl.
CPC .. *H01L 29/78642* (2013.01); *H01L 21/02647* (2013.01); *H01L 29/04* (2013.01); *H01L 29/0847* (2013.01); *H01L 29/1037* (2013.01); *H01L 29/42384* (2013.01); *H01L 29/6656* (2013.01); *H01L 29/6675* (2013.01); *H01L 29/78648* (2013.01); *H01L 29/78696* (2013.01);
(Continued)

(58) Field of Classification Search
CPC ........ H01L 29/78696; H01L 29/78648; H01L 29/66886; H01L 2924/13085; H01L 2924/13092; H01L 29/7831–7832; H01L 29/66484; H01L 29/1037
See application file for complete search history.

(56) References Cited

U.S. PATENT DOCUMENTS 6,316,296 B1 11/2001 Sakamoto
2022/0028861 A1 1/2022 Sharma et al.

OTHER PUBLICATIONS

Notice of Allowance from U.S. Appl. No. 15/938,153 notified Aug. 4, 2021, 10 pgs.
(Continued)

*Primary Examiner* — Amar Movva
(74) *Attorney, Agent, or Firm* — Essential Patents Group, LLP

(57) ABSTRACT

Disclosed herein are dual gate trench shaped thin film transistors and related methods and devices. Exemplary thin film transistor structures include a non-planar semiconductor material layer having a first portion extending laterally over a first gate dielectric layer, which is over a first gate electrode structure, and a second portion extending along a trench over the first gate dielectric layer, a second gate electrode structure at least partially within the trench, and a second gate dielectric layer between the second gate electrode structure and the first portion.

20 Claims, 18 Drawing Sheets

Related U.S. Application Data continuation of application No. 15/938,153, filed on Mar. 28, 2018, now Pat. No. 11,183,594.

(51) Int. Cl.
  *H01L 21/311* (2006.01)
  *H01L 29/04* (2006.01)
  *H01L 29/08* (2006.01)
  *H01L 29/10* (2006.01)
  *H01L 29/423* (2006.01)
  *H01L 29/66* (2006.01)
  *H10B 12/00* (2023.01)

(52) U.S. Cl.
  CPC .......... *H10B 12/05* (2023.02); *H10B 12/315* (2023.02); *H10B 12/50* (2023.02); *H01L 21/31116* (2013.01); *H01L 29/66969* (2013.01); *H01L 29/7869* (2013.01)

(56) References Cited

OTHER PUBLICATIONS

Notice of Allowance from U.S. Appl. No. 17/492,487 notified Aug. 30, 2023, 8 pgs.
Restriction Requirement from U.S. Appl. No. 15/938,153 notified May 14, 2021, 8 pgs.
Restriction Requirement from U.S. Appl. No. 17/492,487 notified May 10, 2023, 6 pgs.

DUAL GATE CONTROL FOR TRENCH SHAPED THIN FILM TRANSISTORS

CLAIM OF PRIORITY

This application is a divisional of, and claims the benefit of priority to, U.S. patent application Ser. No. 17/492,487, filed on Oct. 1, 2021 and titled "DUAL GATE CONTROL FOR TRENCH SHAPED THIN FILM TRANSISTORS," which is a continuation of, and claims the benefit of priority to, U.S. patent application Ser. No. 15/938,153, filed on Mar. 28, 2018 and titled "DUAL GATE CONTROL FOR TRENCH SHAPED THIN FILM TRANSISTORS," which is incorporated by reference in its entirety for all purposes.

BACKGROUND

Thin film transistors (TFT) include a thin film or films of an active semiconductor layer, a gate dielectric separating a gate electrode from the active semiconductor layer, and metallic contacts coupled to the active semiconductor layer over a supporting substrate. TFTs may be contrasted with conventional transistors where the semiconductor material typically is the substrate and/or where the semiconductor material is a crystalline material. TFTs are useful in a variety of contexts including thin film electronics, displays, and embedded memory such as embedded dynamic random access memory (eDRAM).

As such, there is a continuing need for improved TFTs. Such improvements may become critical as the desire to implement TFTs in eDRAM as well as in other applications becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
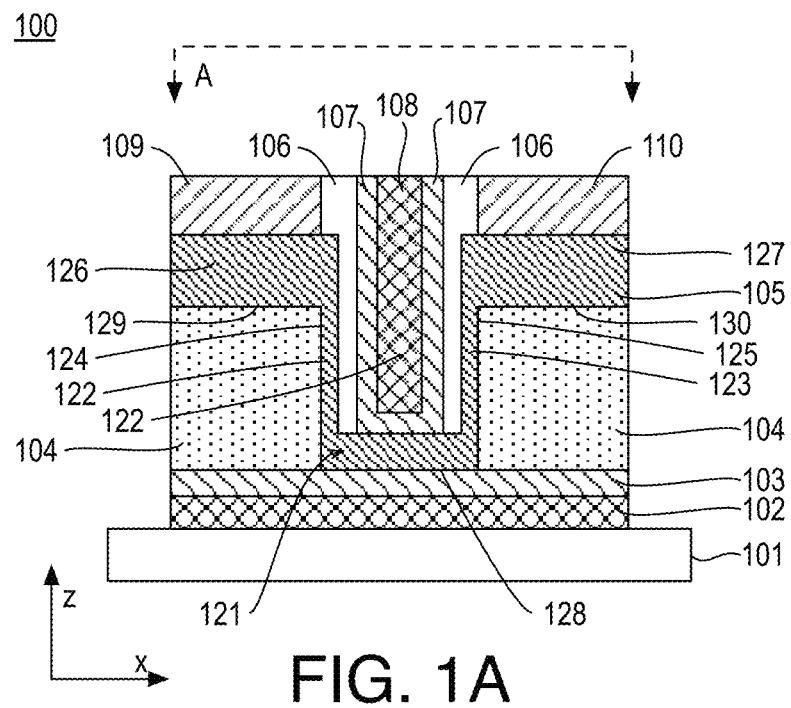
FIG. 1A illustrates a cross-sectional view of an example thin film transistor structure.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause an effect relationship). The term "adjacent" here generally refers to a position of a thing being next to (e g, immediately next to or close to with one or more things between them) or adjoining another thing (e.g., abutting it).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies. The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +1-10% of a predetermined target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Semiconductor device structures, devices, apparatuses, computing platforms, and methods are described below related to dual gate thin film transistors.

As described above, it may be advantageous to provide improved thin film transistor (TFT) structures. In an embodiment, a TFT structure includes a non-planar semiconductor TFT layer. As used herein, a semiconductor TFT layer or simply semiconductor layer may include any suitable semiconductor thin film such as an amorphous or polycrystalline semiconductor material. A polycrystalline material includes any material having micro-scale or nano-scale crystal grains and include nanocrystalline materials. For example, nanocrystalline materials include materials having crystallites that are not larger than 5 nm (e.g., 0.5 to 5 nm in cross sectional length). An amorphous material may be any material that lacks long range order (e.g., has no structural order) and includes interconnected material blocks. As discussed, the non-planar semiconductor TFT layer is non-planar. As used herein, the term non-planar refers to any layer having one or more non-planar surfaces such that the surface deviates from a particular plane. The tern non-planar as used herein indicates one or more portions of the non-planar layer are substantially out of plane with respect to other portions and may be contrasted with substantially planar surfaces that are merely not perfectly planar. For example, a non-planar semiconductor TFT layer may include a first portion over a first gate dielectric layer and a second portion conformal to one or more sidewalls of a trench within a patterned layer such that the patterned layer is adjacent to the first gate dielectric layer and the non-planar layer. For example, a surface of the first gate dielectric layer and the sidewall(s) of the trench may be at an angle with respect to one another such as substantially orthogonal or the like. For example, such a TFT structure may be characterized as a trench-type TFT structure as the non-planar semiconductor layer conforms to a trench.

As discussed, a first portion of the non-planar semiconductor TFT layer maybe over a first gate dielectric layer. A first gate electrode structure may be adjacent the first gate dielectric layer and opposite the first portion such that the first gate electrode structure may control (e.g., exert an electric field on) the first portion of the non-planar semiconductor TFT layer. Furthermore, at least a portion of a second gate electrode structure may be in the trench of the patterned layer and adjacent to the first portion of the non-planar semiconductor TFT layer such that a second gate dielectric layer is between the first portion and the second gate electrode structure. Thereby the first gate electrode may also control (e.g., exert an electric field on) the first portion of the non-planar semiconductor TFT layer. As used herein, the term in or within a trench indicates that the structure is at least partially below or within a surface that would define a boundary of the trench. For example, the surface defining a boundary of a trench extends to connect top edges of sidewalls of the trench. A body that is at least partially in a trench has a portion thereof that extends into the trench across that boundary, either partially or entirely (e.g., the body may be partially or entirely within the trench). The TFT structure may further include a source and a drain coupled to the non-planar semiconductor TFT layer.

Such TFT structures provide dual gate control via the first and second gate electrode structures. The first and second gate electrode structures may be integrated such that the same control (e.g., control signal, switching signal, bias, etc.) is provided via the two gate electrode structures or they may be separate such that different control is provided by the first gate electrode structure with respect to the second gate electrode structure. Such dual gate architectures provide for advantageous control and operational characteristics of non-planar or trench-type TFT structures. For example, dual gate electrode structures (e.g., dual gates) provide for improved short channel control while maintaining low contact resistance and low parasitic gate to source/drain coupling capacitance. For example, the source to drain pathway for non-planar or trench-type TFT structures is longer to provide improved gate control using a second gate. Furthermore, non-planar or trench-type TFT structures provide improved density with respect to planar TFT structures and improved performance as device density increases. For example, non-planar or trench-type TFT structures provide increased effective gate lengths without increasing the lateral footprint of the TFT.

As discussed, a second gate electrode structure extends within a trench and adjacent to a first portion of the non-planar semiconductor TFT layer. For example, the second gate electrode structure extends along the non-planar semiconductor TFT layer on the sidewall of the patterned layer defining the trench. The second gate electrode structure may include a portion of the second gate dielectric layer on a sidewall of the second gate electrode. In some embodiments, a dielectric spacer layer is provided between the non-planar semiconductor TFT layer on the sidewall and the second gate dielectric layer. Such embodiments provide for lower capacitance coupling from the source/drain to the gate. Furthermore, such embodiments may provide doping of the non-planar semiconductor TFT layer via the dielectric spacer layer. In other embodiments, a portion of the source and a portion of the drain are provided between the non-planar semiconductor TFT layer and the second gate dielectric layer. Such embodiments provide for lower contact resistances and maximized overlap for contact area to improve drive current.

Figure 1B:
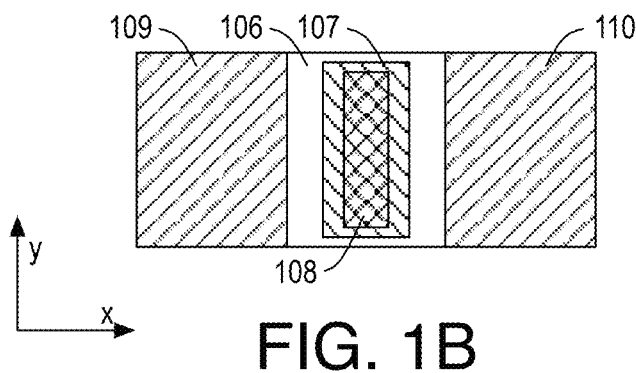
FIG. 1B illustrates a top-down view of the thin film transistor structure of FIG. 1A.

FIG. 1A illustrates a cross-sectional view of an example thin film transistor structure 100 and FIG. 1B is a top-down view of thin film transistor structure 100, arranged in accordance with at least some implementations of the present disclosure. As shown, FIG. 1A provides a cross-sectional view along an x-z plane and FIG. 1B provides a top-down view along the A-plane in FIG. 1A (e.g., along an x-y plane). As illustrated, the x-y plane may be in-plane, in-line, or the like with respect to a lateral direction of thin film transistor structure 100 and the z-direction may be perpendicular with respect to the lateral direction of thin film transistor structure 100.

As shown, thin film transistor structure 100 may include a substrate 101, a gate electrode structure 102, a gate dielectric layer 103, a patterned layer 104, a non-planar semiconductor layer 105, a sidewall spacer 106, a gate dielectric layer 107, a gate electrode structure 108, a source 109, and a drain 110. Notably, thin film transistor structure 100 includes a dual gate architecture including gate electrode structure 102, gate dielectric layer 103, gate dielectric layer 107, and gate electrode structure 108. For example, a portion of non-planar semiconductor layer 105 acts as a semiconductor channel for thin film transistor structure 100.

In some embodiments, gate electrode structure 102 and gate electrode structure 108 are the same material or material(s). In other embodiments, gate electrode structure 102 has a different composition than gate electrode structure 108. Similarly, in some embodiments, gate dielectric layer 103 and gate dielectric layer 107 are the same material or material(s) while in other embodiments, they have different compositions. Furthermore, gate electrode structure 102 and gate electrode structure 108 may be integrated such that the same control (e.g., control signal, switching signal, bias, etc.) is provided via they may be separate such that different control is provided by gate electrode structure 102 with respect to gate electrode structure 108. In an embodiment, gate electrode structure 102 may provide a body potential to control V T while gate electrode structure 108 switches the on/off state of thin film transistor structure 100. In such embodiments, gate dielectric layer 103 may be advantageously thicker than gate dielectric layer 107. For example, gate dielectric layer 103 may be not less than 30% thicker than gate dielectric layer 107. Such integrated or separate control via gate electrode structures 102, 108 may be provided via circuitry (not shown) such as metal interconnect structures.

Thin film transistor structure 100 includes a non-planar or trench-type TFT structure as illustrated with respect to non-planar semiconductor layer 105. Such structures provide for provide improved density with respect to planar TFT structures and improved performance as device density increases. As shown, non-planar semiconductor layer 105 includes a portion 121 that is immediately adjacent to and conformal to gate dielectric layer 103. For example, portion 121 is co-planar with gate dielectric layer 103 such that it extends laterally along gate dielectric layer 103. Non-planar semiconductor layer 105 also includes portions 122, 123 that are along sidewalls 124, 125 of a trench (not labeled in FIG. 1A) of patterned layer 104. As shown, in some embodiments, portions 122, 123 may extend substantially orthogonally with respect to portion 121. In some embodiments, portions 122, 123 extend outwardly from portion 121 such that the trench is at least partially dished. In an embodiment, non-planar semiconductor layer 105 has, from a cross-sectional perspective, a substantially U-shaped structure. In an embodiment, non-planar semiconductor layer 105 has a concave shape. For example, non-planar semiconductor layer 105 and the portions thereof are substantially conformal to a trench defined by a surface 128 of gate dielectric layer 103 and sidewalls 124, 125 of patterned layer 104 and to plateaus 129, 130 of patterned layer 104. As used herein, the term conformal indicates a layer conforms to an underlying structure although the conformity may be at the same or differing thicknesses of the layer across the conforming are. Although patterned layer 104 is illustrated with multiple sidewalls 124, 125, patterned layer 104 may have a single sidewall around the trench.

As shown, gate electrode structure 108 is partially within a trench formed by non-planar semiconductor layer 105 and by surface 128 and sidewalls 124, 125 as discussed above. For example, gate electrode structure 108 includes a portion 131 within a trench defined by surface 128 and sidewalls 124, 125 such that portion 131 is between sidewalls 124, 125 and below plateaus 129, 130. Furthermore, at least a portion of gate electrode structure 108 (including portion 131) is laterally between portions 126, 127 and portions 122, 123 of non-planar semiconductor layer 105. As shown, gate electrode structure 108 extends to proximal of portion 121 of non-planar semiconductor layer 105 such that gate electrode structure 108 may apply an electric field to portion 121 when a bias is applied thereto. Gate dielectric layer 107 is between gate electrode structure 108 and portion 121 and on sidewalls of gate electrode structure 108 (e.g., between sidewall spacer 106 and gate electrode structure 108).

Sidewall spacer 106 is between various portions of non-planar semiconductor layer 105 and gate dielectric layer 107 and between source 109 and gate dielectric layer 107 as well as between drain 110 and gate dielectric layer 107. Sidewall spacer 106 may include any suitable dielectric material and sidewall spacer 106 reduces capacitance coupling from source 109 and drain 110 to gate electrode structure 108. As shown, a portion of sidewall spacer 106 extends over portion 126 of non-planar semiconductor layer 105 and another portion of sidewall spacer 106 extends over portion 127 of non-planar semiconductor layer 105. Furthermore, as shown, a bottom of sidewall spacer 106 extends to portion 121 of non-planar semiconductor layer 105. In an embodiment, sidewall spacer 106 is not employed.

Source 109 and drain 110 are coupled to non-planar semiconductor layer 105 via portions 126, 127, respectively. In some embodiments, source 109 and drain 110 are on non-planar semiconductor layer 105 and, in other embodiments, an intervening layer is provided therebetween.

Substrate 101 may be any suitable material or materials. In some embodiments, substrate 101 includes a semiconductor material such as monocrystalline silicon substrate, a silicon on insulator, or the like. In some embodiments, substrate 101 include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like. In an embodiment, substrate 101 includes underlying layers and devices discussed with respect to FIG. 23. In an embodiment, a top surface or layer of substrate 101 includes a dielectric material for isolation and interconnect (e.g., metallization) routing to gate electrode structure 108.

Gate electrode structures 102, 108 may be any suitable material or materials. Gate electrode structures 102, 108 may include at least one P-type work function metal or N-type work function metal, depending on whether the thin film transistor structure 100 is to be included in a P-type metal oxide semiconductor (PMOS) transistor or an N-type metal oxide semiconductor (NMOS) transistor. For a PMOS transistor, metals that may be used for the gate electrode structures 102, 108 include, but are not limited to, ruthenium, palladium, platinum, cobalt, nickel, and conductive metal oxides (e.g., ruthenium oxide). Such materials may be provided individually or in combination. For an NMOS transistor, metals that may be used for the gate electrode structures 102, 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode structures 102, 108 be a stack of two or more metal layers such that one or more metal layers are work function metal layers and at least one metal layer is a fill metal layer. Further metal layers may be included for other purposes, such as to act as a barrier layer. As discussed, in some embodiments, gate electrode structures 102, 108 are the same material(s) while in other embodiments they have different material(s).

Furthermore, gate dielectric layers 103, 107 may be any suitable dielectric material or materials. In some embodiments, gate dielectric layers 103, 107 are high-k dielectric material layers having dielectric constants of not less than that of silicon dioxide. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layers 103, 107 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. Gate dielectric layers 103, 107 may have any suitable thickness such as thicknesses in the range of 0.5 to 5 nm. In some embodiments, gate dielectric layers 103, 107 are the same material(s) while in other embodiments they have different material(s).

As discussed, thin film transistor structure 100 employs non-planar semiconductor layer 105. Thin film transistor structure 100 performance depends on the composition of the semiconductor employed as non-planar semiconductor layer 105. Thin film transistor structure 100 may include any applicable thin film semiconductor material, including traditional group IV semiconductor materials such as silicon (Si), germanium (Ge), and SiGe alloys. In some embodiments, non-planar semiconductor layer 105 is crystalline (e.g., a single crystal) SI, Ge, or SiGe. In other embodiments, thin film transistor structure 100 may include III-V semiconductor materials. In some embodiments, non-planar semiconductor layer 105 is a crystalline (e.g., a single crystal) III-V semiconductor such as gallium nitride (GaN), indium gallium arsenic (InGaAs), etc. Furthermore, thin film transistor structure 100 may include amorphous (e.g., having no structural order) or polycrystalline (e.g., having micro-scale to nano-scale crystal grains) semiconductor materials including those discussed above. In some embodiments, non-planar semiconductor layer 105 is amorphous or polycrystalline Si, Ge, SiGe, III-V semiconductor, GaN, or InGaAs.

In some embodiments, non-planar semiconductor layer 105 employs an oxide semiconductor. An oxide semiconductor is a semiconducting oxide, or a semiconductor comprising oxygen. For such embodiments, a wide band gap oxide channel material offers low leakage. Semiconducting properties vary with the oxide semiconductor composition and microstructure. An oxide semiconductor thin film can be amorphous (e.g., having no structural order) or polycrystalline (e.g., having micro-scale to nano-scale crystal grains)

Examples of oxide semiconductors for use in non-planar semiconductor layer 105 include metal oxides with a transition metal (e.g., IUPAC group 4-10) or post-transition metal (e.g., IUPAC groups 11-15). In some embodiments, the metal oxide includes at least one of Mg, Cu, Zn, Sn, Ti, Ni, Ga, In, Sb, Sr, Cr, Co, V, or Mo. The metal oxides may be suboxides ($A_2O$), monoxides (AO), binary oxides ($AO_2$), ternary oxides ($ABO_3$), and mixtures thereof. Non-planar semiconductor layer 105 may be a p-type, n-type, or intrinsic material. In some embodiments, non-planar semiconductor layer 105 is n-type as a number of oxide semiconductors have been found to be capable of significant electron densities. Some oxide semiconductors have also been found to be capable of significant electron hole densities. Many oxide semiconductors have high defect density nearer the valence band but display good n-type electrical properties. Some oxide semiconductors have high defect density in the conduction band but display good p-type electrical properties.

In some embodiments, non-planar semiconductor layer 105 is or includes a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. In some embodiments, non-planar semiconductor layer 105 comprises a zinc oxide ($ZnO_x$), such as Zn(II) oxide, or ZnO. In other embodiments, the zinc oxide is zinc dioxide ($ZnO_2$) or a mixture of ZnO and $ZnO_2$, where x may range between 1 and 2. In some other embodiments, non-planar semiconductor layer 105 comprises titanium oxide ($TiO_x$), or $SnO_x$ Exemplary oxide semiconductors that may have suitable p-type conductivity include copper oxide ($CuO_x$) In some $CuO_x$ embodiments, non-planar semiconductor layer 105 is Cu(I) oxide, or $Cu_2O$. In other embodiments, non-planar semiconductor layer 105 is Cu(II) oxide (CuO) or a mixture of CuO and $Cu_2O$, where x may range between 0.5 and 1. Still other exemplary oxide semiconductor compositions include $NiO_x$. Any dopants, such as Al, may also be added to any of these metal oxides, such as ZnO.

Non-planar semiconductor layer 105, or various portions thereof, may be intentionally doped, or not. Compared to intrinsic oxide semiconductors that are not intentionally doped, n-type and p-type oxide semiconductors may have a higher concentration of impurities, such as, but not limited to, one or more group III element, group V element, and/or elemental hydrogen (H), and/or oxygen vacancies. Dopant levels in non-planar semiconductor layer 105 may be selected to arrive at an optimal threshold voltage associated with gating the oxide semiconductor within the channel and/or for lowest bulk and/or junction resistance within the source/drain region. In embodiments where non-planar semiconductor layer 105 comprises $ZnO_x$, the dopants may include In and Ga. In an embodiment, non-planar semiconductor layer 105 is $InGaO_3(ZnO)_5$ (e.g., IGZO).

Source 109 and drain 110 couple to non-planar semiconductor layer 105 and provide a contact to routing of metallization layers and other circuitry. Source 209 and drain 210 may be characterized as a source electrode and a drain electrode, respectively. Source 109 and drain 110 may include any suitable material or materials. In some embodiments, source 109 and drain 110 includes one or more of a titanium film and an aluminum film. Sidewall spacer 106 may include any suitable dielectric material. For example, sidewall spacer 106 may have any composition known to be suitable for electrical isolation, such as, but not limited to, materials including silicon and oxygen (SiO), materials including silicon and nitrogen (SiN), materials including silicon, oxygen, and nitrogen (SiON), low-k materials including a dopant (e.g., SiOF, SiOC), organosilicates, HSQ, MSQ, etc. Patterned layer 104 may include any suitable dielectric material. For example, patterned layer 104 may have any composition known to be suitable for electrical isolation, such as, but not limited to, materials including silicon and oxygen (SiO), materials including silicon and nitrogen (SiN), materials including silicon, oxygen, and nitrogen (SiON), low-k materials including a dopant (e.g., SiOF, SiOC), organosilicates, HSQ, MSQ, etc. High-k materials (e.g., metal oxides) such as those reference with respect to gate dielectric layers 103, 107 may also be employed as sidewall spacer 106 and patterned layer 104. In an embodiment, thin film transistor structure 100 is within a field oxide, polymeric sacrificial light absorbing materials, or the like as discussed further herein.

As discussed, the architecture of thin film transistor structure 100 offers the advantages of a trench-type TFT (e.g., improved density with respect to planar TFT structures) and dual gate control (e.g., better short channel control, low contact resistance, and low parasitic gate to source/drain capacitance). In particular, thin film transistor structure 100 provides reduced capacitance from source/drain to gate due to sidewall spacer 106.

Figure 2A:
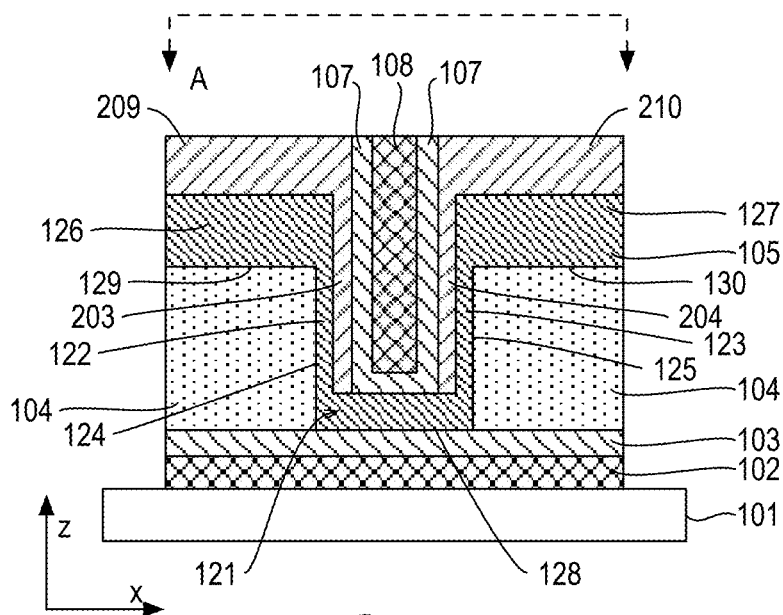
FIG. 2A illustrates a cross-sectional view of another example thin film transistor structure.
Figure 2B:
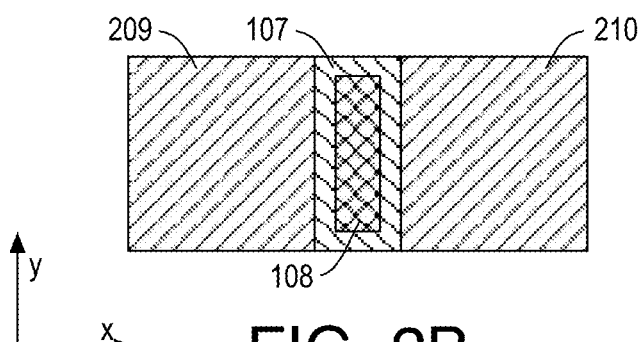
FIG. 2B illustrates a top-down view of the thin film transistor structure of FIG. 2A.

FIG. 2A illustrates a cross-sectional view of another example thin film transistor structure 200 and FIG. 2B is a top-down view of thin film transistor structure 200, arranged in accordance with at least some implementations of the present disclosure. As shown, FIG. 2A provides a cross-sectional view along an x-z plane and FIG. 2B provides a top-down view along the A-plane in FIG. 12A (e.g., along an x-y plane). As illustrated, the x-y plane may be in-plane, in-line, or the like with respect to a lateral direction of thin film transistor structure 200 and the z-direction may be perpendicular with respect to the lateral direction of thin film transistor structure 200.

As shown, thin film transistor structure 200 may include substrate 101, gate electrode structure 102, gate dielectric layer 103, patterned layer 104, non-planar semiconductor layer 105, gate dielectric layer 107, gate electrode structure 108, a source 209, and a drain 210. Source 209 and drain 210 may be characterized as a source electrode and a drain electrode, respectively. Notably, thin film transistor structure 200 includes a dual gate architecture similar to that of thin film transistor structure 100 without sidewall spacer 106 and having source 209 and drain 210 with extended portions 203, 204 respectively. Components of thin film transistor structure 200 having the same reference numerals may have any of the characteristics (e.g., orientations, materials, etc.) as those illustrated and discussed with respect to thin film transistor structure 100. Such characteristics will not be repeated for the sake of brevity and clarity of presentation.

Thin film transistor structure 200 includes a source 209 and a drain 210. As shown, source 209 includes a portion 203 between portions 122, 126 of non-planar semiconductor layer 105 and, similarly, drain 210 includes a portion 204 between portions 123, 127 of non-planar semiconductor layer 105. Furthermore, portion 203 of source 209 extends to contact portion 121 of non-planar semiconductor layer 105 and portion 204 of drain 210 extends to contact portion 121 of non-planar semiconductor layer 105. Such an architecture provides for source 209 and drain 210 (e.g., source and drain metals) adjacent to the portions 203, 204 of non-planar semiconductor layer 105 (e.g., along sidewalls of non-planar semiconductor layer 105), which advantageously reduces contact resistance between source 209 and non-planar semiconductor layer 105 and between drain 210 and non-planar semiconductor layer 105. As with source 109 and drain 110, source 209 and drain 210 couple to non-planar semiconductor layer 105 and provide a contact to routing of metallization layers and other circuitry. Source 209 and drain 210 may include any suitable material or materials. In some embodiments, source 109 and drain 110 includes one or more of a titanium film and an aluminum film.

Figure 3:
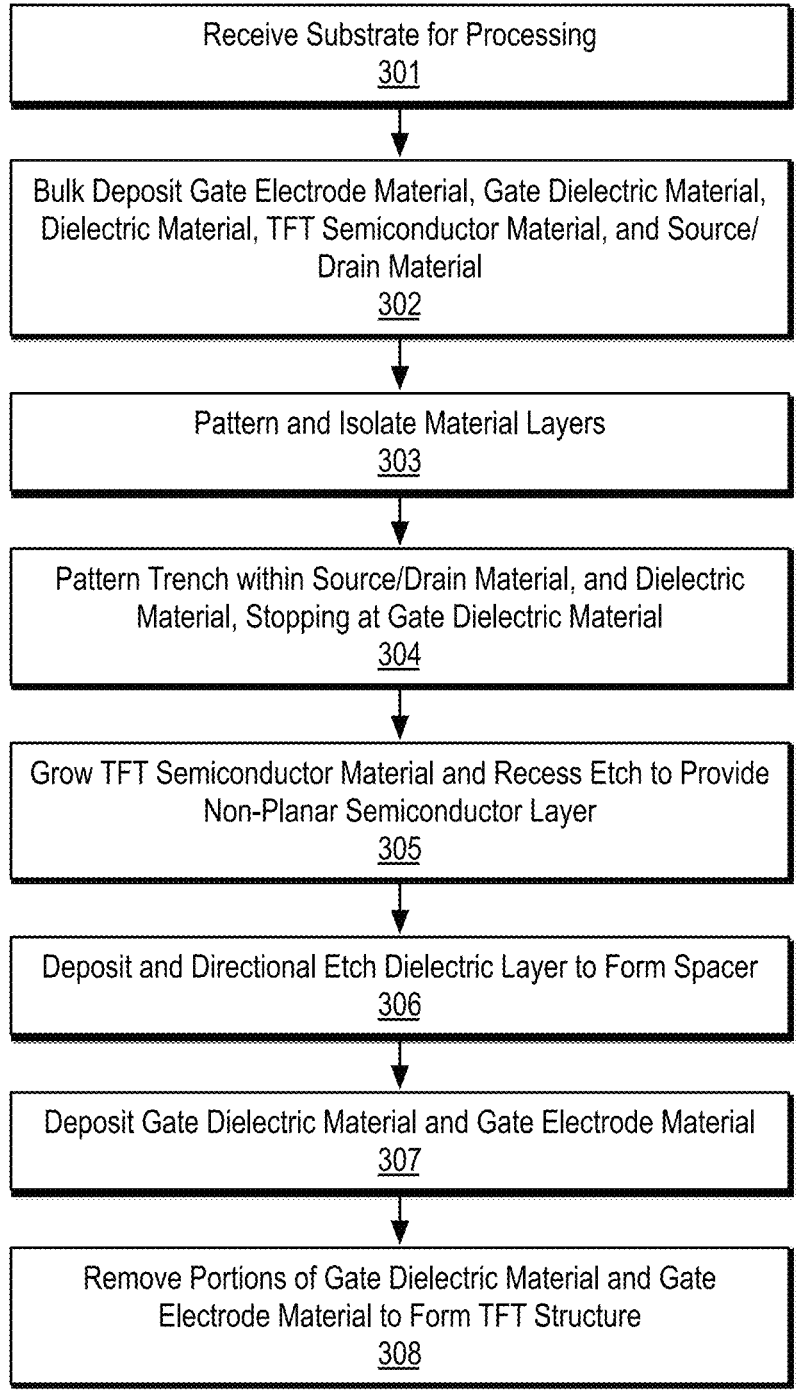
FIG. 3 illustrates a flow diagram illustrating an example process for fabricating thin film transistor structures.

FIG. 3 illustrates a flow diagram illustrating an example process 300 for fabricating thin film transistor structures, arranged in accordance with at least some implementations of the present disclosure. For example, process 300 may be implemented to fabricate thin film transistor structure 100 or any other thin film transistor structure discussed herein. In the illustrated implementation, process 300 may include one or more operations as illustrated by operations 301-308. However, embodiments herein may include additional operations, certain operations being omitted, or operations being performed out of the order provided. In an embodiment, process 300 may fabricate thin film transistor structure 1700 as discussed further herein with respect to FIGS. 4-17.

Process 300 may begin at operation 301, where a substrate may be received for processing. The substrate may include any suitable substrate such as a silicon wafer or the like. In some embodiments, the substrate includes underlying devices or electrical interconnects or the like. For example, the substrate may include peripheral circuitry, metallization layers, and interlayer dielectric materials as discussed with respect to FIG. 23.

Processing may continue at operation 302, where a bulk gate electrode material, a bulk gate dielectric material, a bulk dielectric material, a thin film transistor semiconductor material, and a source/drain material may be disposed on the substrate. For example, each material may be disposed as a layer on the substrate and then each preceding layer. Such bulk material depositions may be performed using any suitable technique or techniques. The gate electrode material may include any characteristics discussed with respect to gate electrode structure 102, the gate dielectric material may include any characteristics discussed with respect to gate dielectric layer 103, the dielectric material may include any characteristics discussed with respect to patterned layer 104, the thin film transistor semiconductor material may include any characteristics discussed with respect to non-planar semiconductor layer 105, and the source/drain material may include any characteristics discussed with respect to gate dielectric layer 107. In an embodiment, such bulk materials or material layers may be disposed over substrate 101 as discussed with respect to FIG. 4. As discussed, at operations 302, multiple layers are disposed. Such operations may be characterized as disposition or deposition operations, which may be performed separately or together.

Processing may continue at operation 303, where the material layers disposed at operation 302 are patterned and isolated. For example, the material layers may be patterned into mesas or the like and isolated for the formation of thin film transistor structures. The material layers may be patterned using any suitable technique or techniques such as lithography and etch techniques. Furthermore, the patterned material layers may be isolated using any suitable technique or techniques such as material deposition and planar techniques. The material used to isolate the patterned material layers (and ultimately the thin film transistor structures) may be any suitable material or material such as polymeric sacrificial light absorbing materials. In an embodiment, the material layers may be patterned and isolated as discussed with respect to FIGS. 5, 6A, and 6B.

Processing may continue at operation 304, where a trench may be patterned into some the material layers. For example, the isolated material layers may be patterned to form a trench therein such that the trench extends through the source/drain material, the thin film transistor semiconductor material, and the dielectric material (which may be characterized as a patterned layer) but not through the gate dielectric material (nor the gate electrode material) such that the trench provides an opening to the gate dielectric material and has sidewalls including the source/drain material, the thin film transistor semiconductor material, and the dielectric material. The trench may be formed using any suitable technique or techniques such as lithography and etch techniques. In an embodiment, the material layers may be patterned to form a trench or opening as discussed with respect to FIGS. 7A, 7B, 8, and 9.

Processing may continue at operation 305, where a thin film transistor semiconductor material may be grown within the trench and a recess etch may be performed to provide a non-planar thin film transistor semiconductor material layer along sidewalls of the patterned layer (e.g., the patterned dielectric material) and the exposed surface of the gate dielectric material within the trench. The thin film transistor semiconductor material growth may be performed using any suitable technique or techniques such as lateral epitaxial overgrowth (LEO) techniques using the exposed portions of the thin film transistor semiconductor material within the trench as a seed material. Such LEO techniques may provide thin film transistor semiconductor material along sidewalls of the patterned layer and the exposed surface of the gate dielectric material within the trench but also along at least portions of the source/drain material. The thin film transistor semiconductor material on the source/drain material may optionally be removed using recess etch techniques such as providing a fill material such as an oxide and etching the fill material and the thin film transistor semiconductor material and subsequently selectively etching the fill material. In an embodiment, the thin film transistor semiconductor material growth and recess etch may be performed as discussed with respect to FIGS. 10, 11, 12, and 13.

Processing may continue at operation 306, where a conformal dielectric layer may be deposited and directionally etched to form a sidewall spacer along sidewalls of the source/drain materials and the thin film transistor semiconductor material within the trench while exposing a surface of the thin film transistor semiconductor material within the trench. The dielectric spacer layer may be deposited using any suitable technique or techniques such as chemical vapor deposition (CVD), plasma enhanced chemical vapor deposition (PECVD), or physical vapor deposition (PVD). Furthermore, the directional etch may be performed using any suitable technique or techniques such as dry etch techniques. In an embodiment, sidewall spacers may be formed as discussed with respect to FIGS. 14 and 15.

Processing may continue at operation 307, where a gate dielectric material may be conformally disposed over the exposed source and drain material, the sidewall spacer and the exposed thin film transistor semiconductor material within the trench and a gate electrode material may be disposed over the gate dielectric material. The gate dielectric material may be disposed using any suitable technique or techniques such as CVD, PECVD, PVD, electroplating, etc. In an embodiment, the gate dielectric material and the gate electrode material may be disposed over the source and drain material, the sidewall spacer and the thin film transistor semiconductor material as discussed with respect to FIG. 16.

Processing may continue at operation 308, where portions of the gate dielectric material and the gate electrode material may be removed to form a TFT structure. For example, the TFT structure may have a discrete gate electrode structure having an exposed surface (e.g., for contact by a via or other metallization) such that the other surfaces of the gate electrode structure have a gate dielectric layer thereon. The portions of the gate dielectric material and the gate electrode material may be removed using any suitable technique or techniques such as planarization techniques. In an embodiment, the portions of the gate dielectric material and the gate electrode material may be removed as discussed with respect to FIGS. 17A and 17B.

FIGS. 4, 5, 6A, 7A, 8, 9, 10, 11, 12, 13, 14, 15, 16, and 17A illustrate cross-sectional side views of example thin film transistor structures as particular fabrication operations are performed, arranged in accordance with at least some implementations of the present disclosure. FIGS. 6B, 7B, and 17B illustrate top-down views of the thin film transistor structures of FIGS. 6A, 7A, and 17A, respectively.

Figure 4:
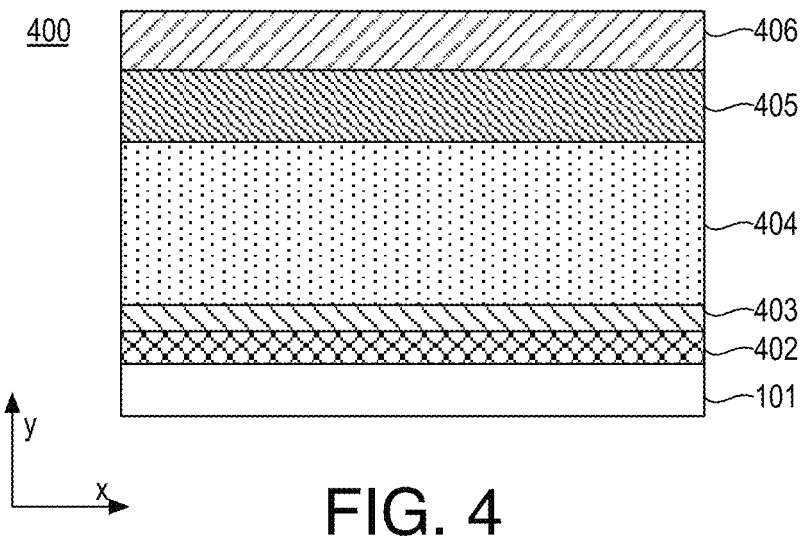
FIGS. 4, 5, 6A, 7A, 8, 9, 10, 11, 12, 13, 14, 15, 16, and 17A illustrate cross-sectional side views of example thin film transistor structures as particular fabrication operations are performed.

As shown in FIG. 4, thin film transistor (TFT) structure 400 includes substrate 101, a gate electrode material layer 402, a gate dielectric material layer 403, a dielectric layer 404, a semiconductor layer 405, and a source and drain material layer 406. Thin film transistor (TFT) structure 400 may be fabricated using any suitable technique or techniques. In an embodiment, substrate 101 is received for processing. Substrate 101 may include any materials, devices, and characteristics as discussed herein. In an embodiment, substrate 101 includes peripheral circuitry, metallization layers, and interlayer dielectric materials, etc. as discussed with respect to FIG. 23.

Gate electrode material layer 402 may be formed over or on substrate 101 using any suitable technique or techniques such as CVD, PECVD, PVD, electroplating, etc. Gate electrode material layer 402 may include any suitable materials and characteristics as discussed with respect to gate electrode structure 102. Gate dielectric material layer 403 may then be formed over or on gate electrode material layer 402 using any suitable technique or techniques such as CVD, PECVD, PVD, etc. Gate dielectric material layer 403 may include any suitable materials and characteristics as discussed with respect to gate dielectric layer 103. Subsequently, dielectric layer 404 may be formed over or on gate dielectric material layer 403 using any suitable technique or techniques such as CVD, PECVD, PVD, etc. Dielectric layer 404 may include any suitable materials and characteristics as discussed with respect to patterned layer 104. Next, semiconductor layer 405 is formed over or on dielectric layer 404 using any suitable technique or techniques such as metal-organic chemical vapor deposition (MOCVD), vapor phase epitaxy (VPE), hydride vapor phase epitaxy (HYPE), molecular beam epitaxy (MBE), CVD, PECVD, PVD, etc. In some embodiments, layer transfer techniques may be used to form semiconductor layer 405 of a monocrystalline material. Semiconductor layer 405 may include any materials and characteristics as discussed with respect to non-planar semiconductor layer 105. Finally, source and drain material layer 406 (e.g., a metal layer) is formed over or on semiconductor layer 405 using any suitable technique or techniques such as CVD, PECVD, PVD, electroplating, etc. Source and drain material layer 406 may include any suitable materials and characteristics as discussed with respect to source 109 and drain 110 and/or source 209 and drain 210. In an embodiment, the component layers are provided as bulk layers over an entirety (or substantially and entirety) of substrate 101.

Figure 5:
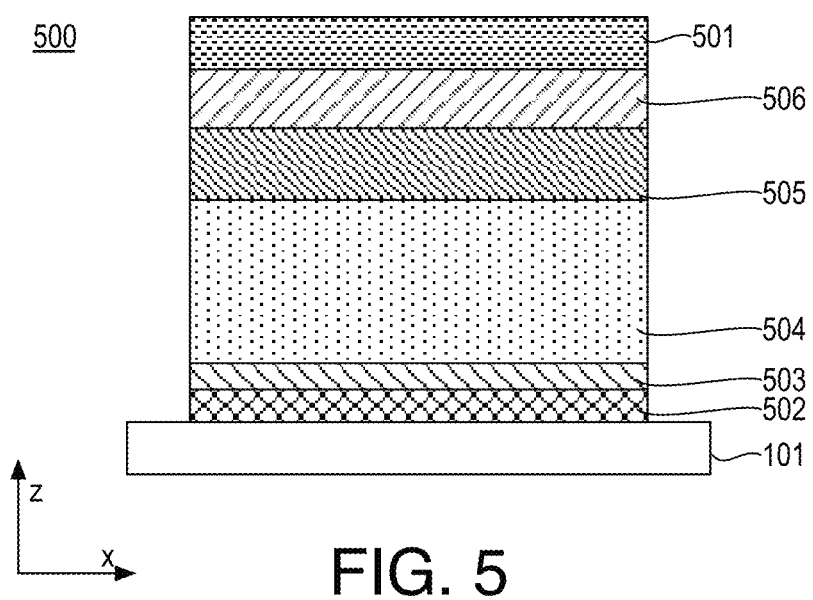

FIG. 5 illustrates a TFT structure 500 similar to TFT structure 400, after the formation of a patterned layer 501 on source and drain material layer 406 and subsequent patterning to form a gate electrode material layer 502, a gate dielectric material layer 503, a dielectric layer 504, a semiconductor layer 505, and a source and drain material layer 506, which may be characterized as patterned layers or the like. Patterned layer 501 may be formed using any suitable technique or techniques such as photolithography techniques and gate electrode material layer 402, gate dielectric material layer 403, dielectric layer 404, semiconductor layer 405, and source and drain material layer 406 may be patterned to form gate electrode material layer 502, gate dielectric material layer 503, dielectric layer 504, semiconductor layer 505, and source and drain material layer 506 using any suitable technique or techniques such as etch techniques.

Figure 6A:
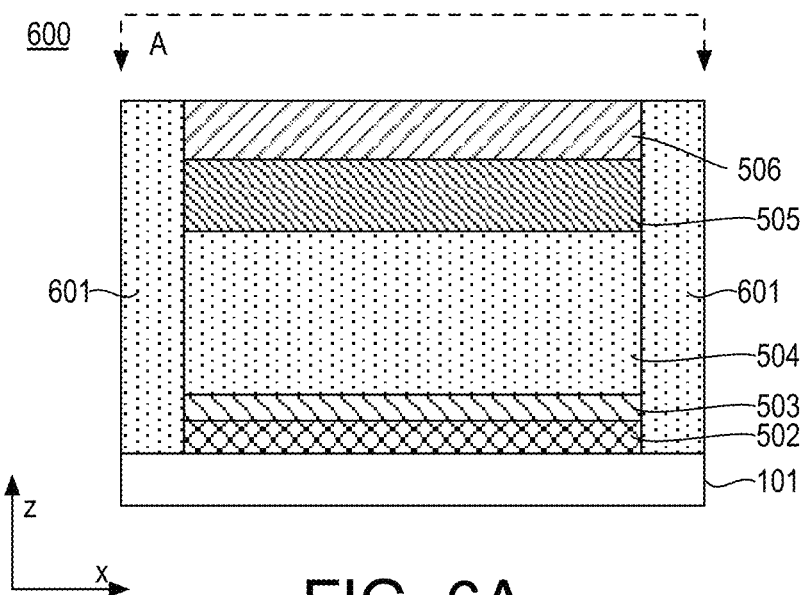
Figure 6B:
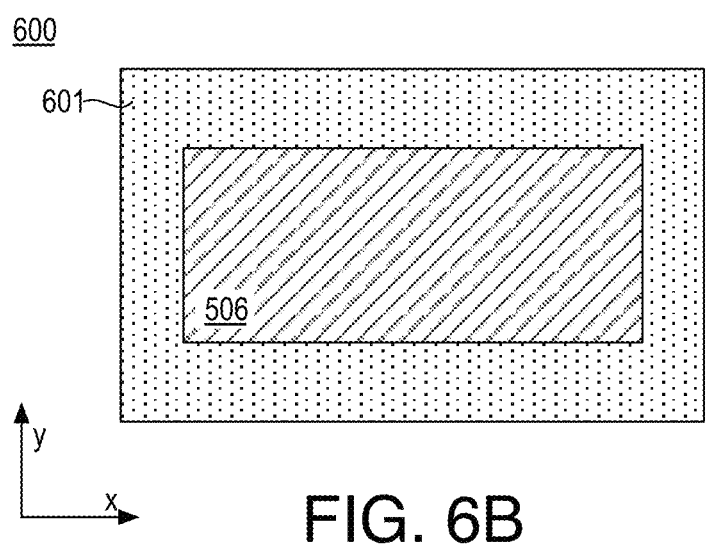
FIGS. 6B, 7B, and 17B illustrate top-down views of the thin film transistor structures of FIGS. 6A, 7A, and 17A, respectively.

FIGS. 6A and 6B illustrates a TFT structure 600 similar to TFT structure 500, after the removal of patterned layer 501 via etch techniques or the like and after the formation of a field insulator layer 601. Field insulator layer 601 may be or include any suitable electrically isolating dielectric material such as polymeric sacrificial light absorbing materials. Field insulator layer 601 may be formed using any suitable technique or techniques such as bulk deposition and planarization techniques. As shown in FIG. 6B, which provides a top-down view along the A-plane in FIG. 6A, field insulator layer 601 may surround gate electrode material layer 502, gate dielectric material layer 503, dielectric layer 504, semiconductor layer 505, and source and drain material layer 506 such that the surrounded material layers provide a field or location or the like for the formation of a TFT structure. In the illustrated embodiments, field insulator layer 601 surrounds each TFT structure. In other embodiments, multiple TFTs may be formed within an insulated region such that the multiple TFTs share non-planar semiconductor layer 105.

Figure 7A:
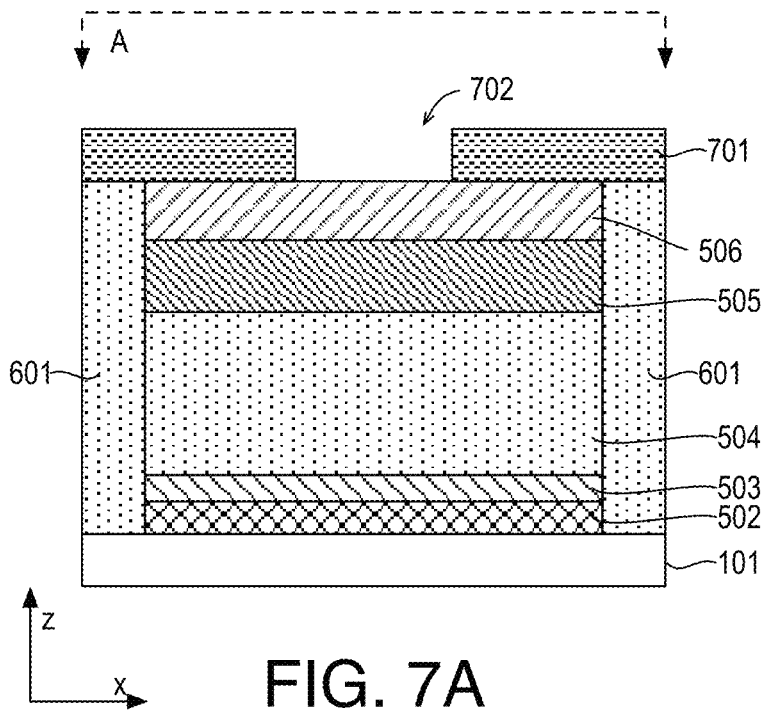
Figure 7B:
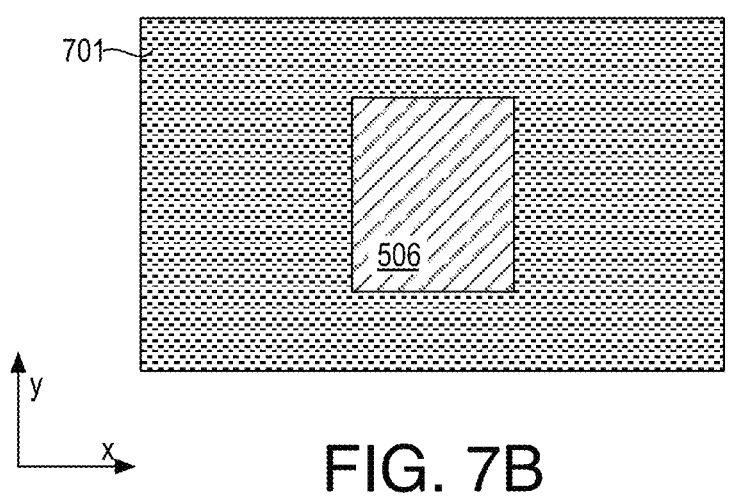

FIGS. 7A and 7B illustrates a TFT structure 700 similar to TFT structure 600, after the formation of patterned layer 701 via lithography techniques or the like. As shown, patterned layer 701 includes an opening 702 that will define a trench or opening to be formed within source and drain material layer 506, semiconductor layer 505, and dielectric layer 504 and stopping at gate dielectric material layer 503 such that a top surface of gate dielectric material layer 503 defines a bottom of the trench or opening. As shown in FIG. 7B, which provides a top-down view along the A-plane in FIG. 7A, patterned layer 701 may be fully within source and drain material layer 506 (and the layers below) such that the subsequent trench is isolated within the discussed material layers.

Figure 8:
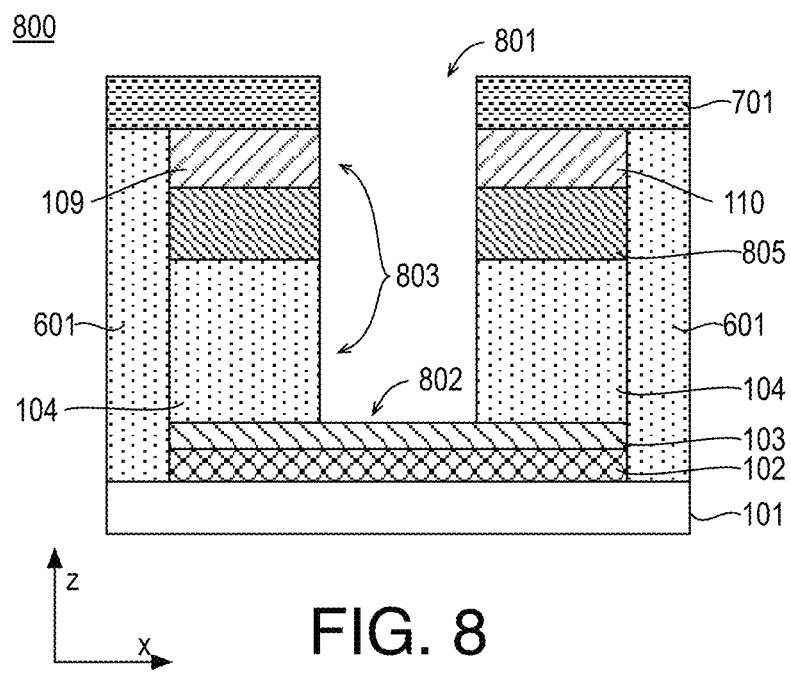
Figure 9:
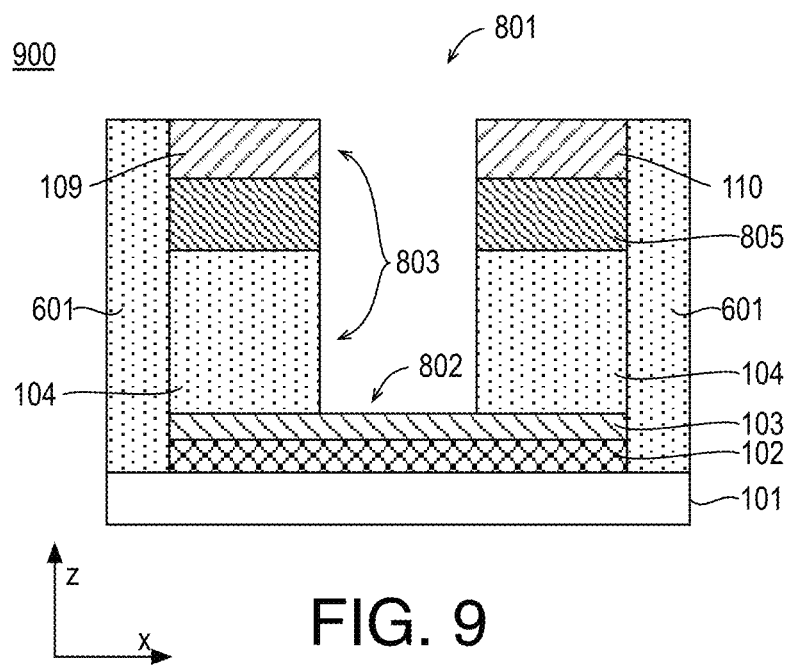

FIG. 8 illustrates a TFT structure 800 similar to TFT structure 600, after the formation of a trench 801. Trench 801 may be formed using any suitable technique or techniques such as selective etch techniques or the like. The formation of trench 801 further provides for patterned layer 104, source 109, and drain 110 as discussed herein. As shown, trench 801 includes a surface 802 (or portion) of gate dielectric layer 103 and sidewall(s) 803, which includes a sidewall or sidewalls of patterned layer 104, a patterned semiconductor layer 805, and source 109 or drain 110. Trench 801 may have any suitable shape from a top-down perspective such as square or rectangular (please see FIG. 7B). Although illustrated with orthogonal sidewalls(s) 803, trench 801 may have sidewalls that have an obtuse angle (e.g., an angle in the range of >90° to) 120° with respect to the x-y plan, dished or slightly curved (concave) sidewalls, etc. Furthermore, each sidewall portion of patterned layer 104, patterned semiconductor layer 805, and source 109 or drain 110 may have differing characteristics due to differing material choices, etch conditions, etc. FIG. 9 illustrates a TFT structure 900 similar to TFT structure 800, after the removal of patterned layer 701 via etch techniques or the like.

Figure 10:
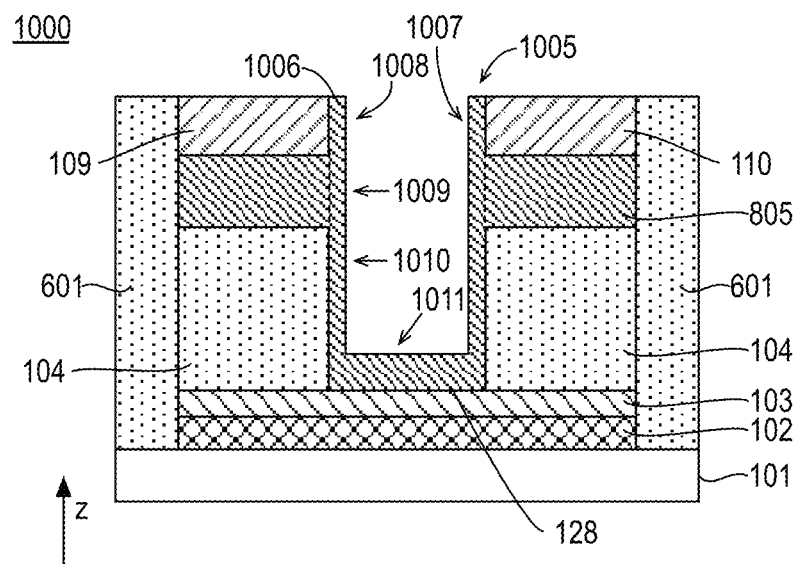

FIG. 10 illustrates a TFT structure 1000 similar to TFT structure 900, after the formation of a semiconductor layer structure 1005. As shown, semiconductor layer structure 1005 includes patterned semiconductor layer 805 and a semiconductor layer portion 1006 with the separation indicated by hatched vertical lines. Semiconductor layer portion 1006 may be formed using any suitable technique or techniques such as lateral epitaxial overgrowth techniques. Semiconductor layer portion 1006 may include the same or different material as patterned semiconductor layer 805. For example, semiconductor layer portion 1006 may include any materials and characteristics as discussed with respect to non-planar semiconductor layer 105. As shown, semiconductor layer portion 1006 may begin growth at locations 1009 of patterned semiconductor layer 805 such that semiconductor layer portion 1006 may be integral with patterned semiconductor layer 805. In some embodiments, semiconductor layer portion 1006 includes a monocrystalline material formed from monocrystalline material seed(s) at location 1009. Furthermore, semiconductor layer portion 1006 may include a portion 1008 over a sidewall of source 109, a portion 1007 over a sidewall of drain 110, a portion 1010 integral to over sidewall(s) of patterned layer 104, and a portion 1011 on surface 128 of gate dielectric layer 103 (please refer to FIGS. 1A and 2A). In some embodiments, portions 1007, 1008 of semiconductor layer structure 1005 may be removed as discussed with respect to FIGS. 11, 12, and 13. In other embodiments, portions 1007, 1008 of semiconductor layer structure 1005 may remain adjacent to drain 110 and source 109, respectively. In yet other embodiments, portions 1007, 1008 may not be formed due to selective growth of semiconductor layer portion 1006 on surfaces other than the surfaces of source 109 and drain 110.

Figure 11:
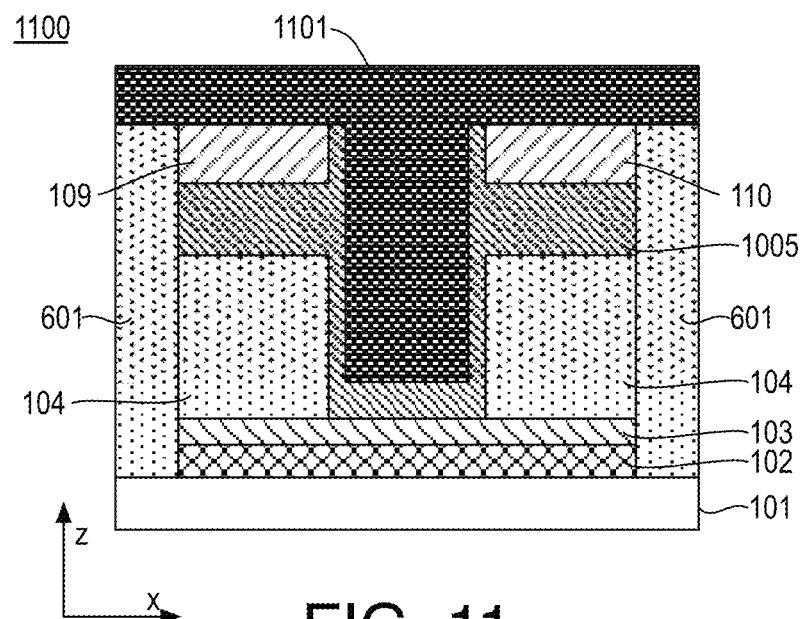
Figure 12:
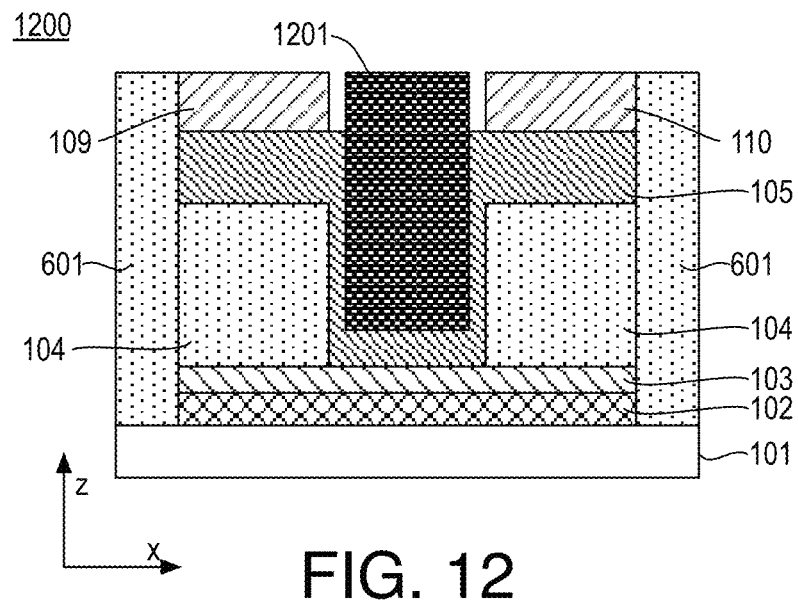
Figure 13:
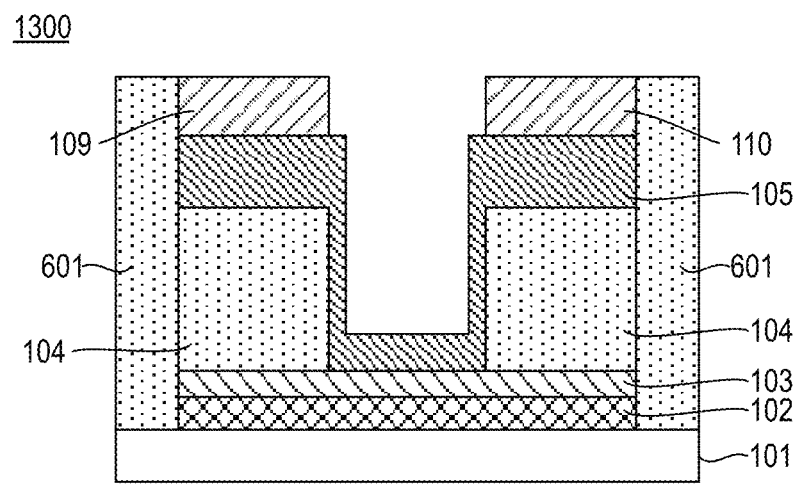

FIG. 11 illustrates a TFT structure 1100 similar to TFT structure 1000, after the formation of fill material 1101. Fill material 1101 may include any suitable material such as an oxide and may be formed using any suitable technique or techniques such as CVD, PECVD, PVD, etc. FIG. 12 illustrates a TFT structure 1200 similar to TFT structure 1100, after a recess etch to remove portions of fill material 1101 and portions 1007, 1008 (please refer to FIG. 10) of semiconductor layer structure 1005 and to provide non-planar semiconductor layer 105 as discussed herein and a fill material 1201. The recess etch may be performed using any suitable technique or techniques such as directional dry etch techniques. FIG. 13 illustrates a TFT structure 1300 similar to TFT structure 1200, after the removal of fill material 1201. Fill material 1201 may be removed using any suitable technique or techniques such as selective etch techniques.

Figure 14:
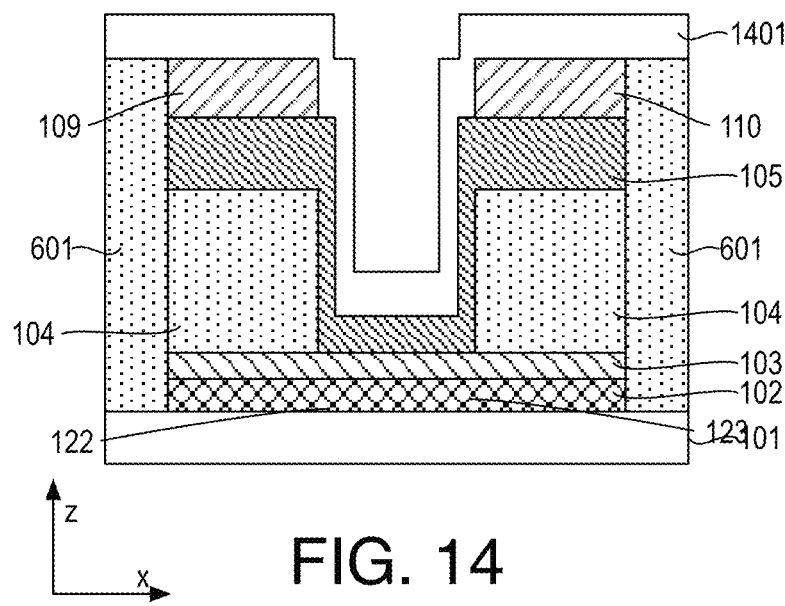

FIG. 14 illustrates a TFT structure 1400 similar to TFT structure 1300, after the formation of a conformal dielectric layer 1401. Conformal dielectric layer 1401 may include any material or materials discussed herein with respect to sidewall spacer 106. Conformal dielectric layer 1401 may be formed using any suitable conformal deposition technique such as CVD, PECVD, PVD, etc. As shown, conformal dielectric layer 1401 is conformal to exposed surfaces of field insulator layer 601, source 109, drain 110, and non-planar semiconductor layer 105. In an embodiment, conformal dielectric layer 1401 may be used to dope non-planar semiconductor layer 105 to reduce resistance in non-planar semiconductor layer 105. For example, a dopant may be provided in conformal dielectric layer 1401 and subsequently driven into non-planar semiconductor layer 105 via an anneal operation.

Figure 15:
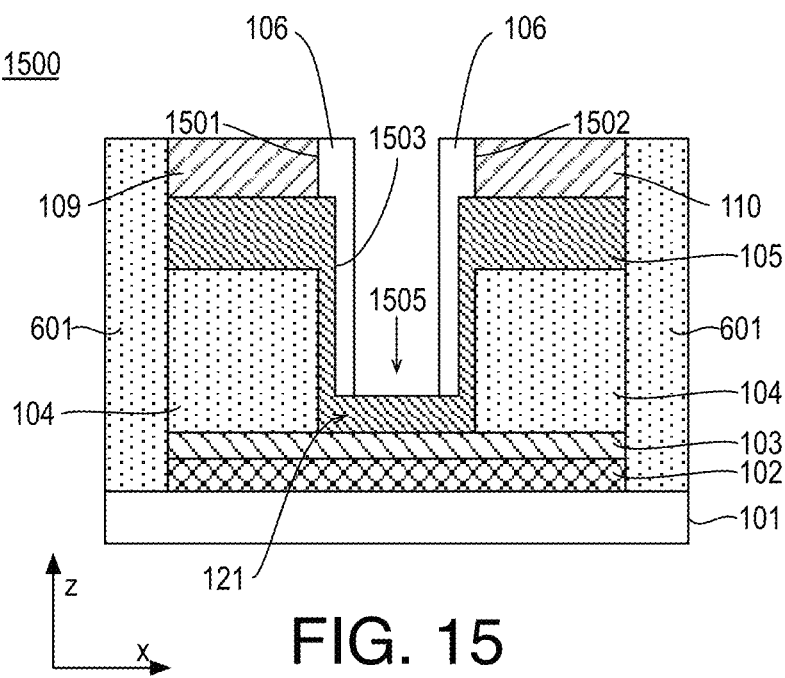

FIG. 15 illustrates a TFT structure 1500 similar to TFT structure 1400, after a directional etch of conformal dielectric layer 1401 to form sidewall spacer 106. The directional etch may be performed using any suitable technique or techniques such as dry etch techniques. Sidewall spacer 106 is on a sidewall 1501 of source 109, a sidewall 1502 of drain 110, and a sidewall 1503 (or sidewalls) of non-planar semiconductor layer 105. Furthermore, the directional etch exposes top surfaces of field insulator layer 601, source 109, and drain 110, and a top surface 1505 of portion 121 of non-planar semiconductor layer 105. For example, top surface 1505 may be exposed for the application of gate dielectric and gate electrode (e.g., a gate stack) while sidewall 1503 may be coated with sidewall spacer 106 to lower capacitance to the gate electrode. In an embodiment, sidewall spacer 106 may be used to dope sidewall portions of non-planar semiconductor layer 105 (e.g., those portions of non-planar semiconductor layer 105 in contact with sidewall spacer 106) to reduce resistance of non-planar semiconductor layer 105. For example, a dopant may be provided in conformal dielectric layer 1401 and, subsequent to performing the directional etch, such dopants may be driven from sidewall spacer 106 into non-planar semiconductor layer 105 via an anneal operation.

Figure 16:
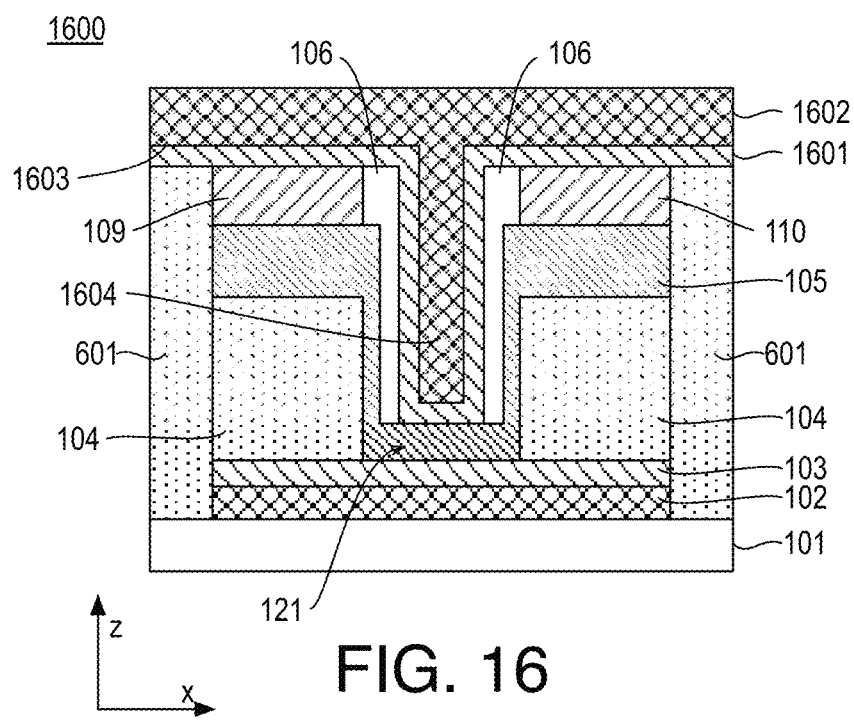

FIG. 16 illustrates a TFT structure 1600 similar to TFT structure 1500, after the formation of a gate dielectric layer 1601 and a gate electrode layer 1602. Gate dielectric layer 1601 may include any materials and characteristics discussed herein with respect to gate dielectric layer 107. Gate dielectric layer 1601 may be formed using any suitable technique or techniques such as CVD, PECVD, PVD, etc. As shown, gate dielectric layer 1601 may be formed conformally to exposed surfaces of field insulator layer 601, source 109, drain 110, sidewall spacer 106, and non-planar semiconductor layer 105 (e.g., the exposed surface of portion 121 of non-planar semiconductor layer 105). Furthermore, gate electrode layer 1602 may be formed over gate dielectric layer 1601 using any suitable technique or techniques such as CVD, PECVD, PVD, etc. Gate electrode material layer 1602 may include any suitable materials and characteristics as discussed with respect to gate electrode structure 108. As shown, gate electrode layer 1602 may fill a trench 1604 of gate dielectric layer 1601 as a fill and cover plateaus 1603 of gate dielectric layer 1601 extending laterally in the x-y plane. Furthermore, portion 1604 of gate electrode layer 1602 is within sidewall spacer 106 (e.g., between portions of sidewall spacer 106), between source 109 and drain 110, and within a trench of non-planar semiconductor layer 105.

Figure 17A:
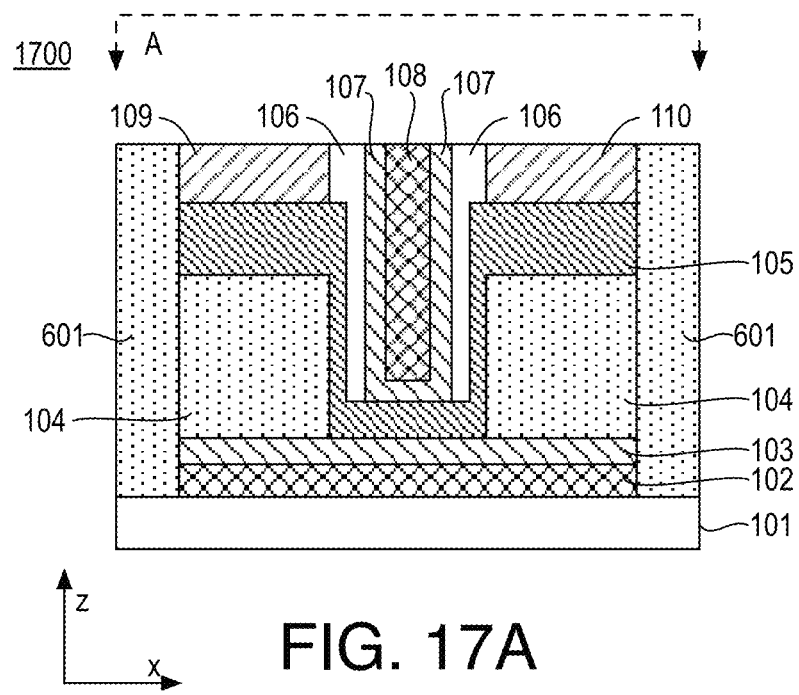
Figure 17B:
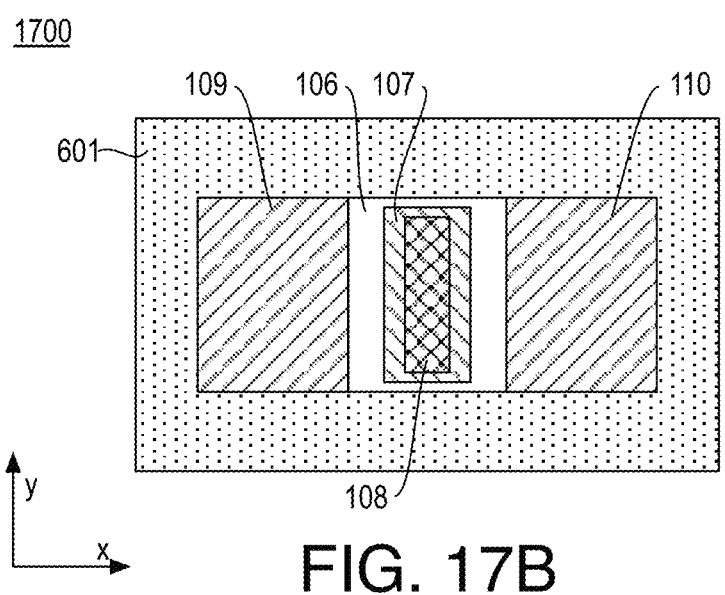

FIGS. 17A and 17B illustrates a TFT structure 1700 similar to TFT structure 1600, after the removal of portions of gate electrode layer 1602 and gate dielectric layer 1601 to form gate dielectric layer 107 and gate electrode structure 108. The portions of gate electrode layer 1602 and gate dielectric layer 1601 may be removed using any suitable technique or techniques such as planarization techniques. For example, TFT structure 1700 substantially matches TFT structure 100 and illustrates TFT structure 100 within field insulator layer 601. As shown in FIG. 17B, which provides a top-down view along the A-plane in FIG. 17A, gate electrode structure 102, gate dielectric layer 103, patterned layer 104, non-planar semiconductor layer 105, sidewall spacer 106, gate dielectric layer 107, gate electrode structure 108, source 109, and drain 110 may be isolated within field insulator layer 601. In the illustrated embodiment, a single TFT is within an opening of field insulator layer 601. In other embodiments multiple TFTs may be within an opening. For example, the multiple TFTs may share a common non-planar semiconductor layer 105.

Figure 18:
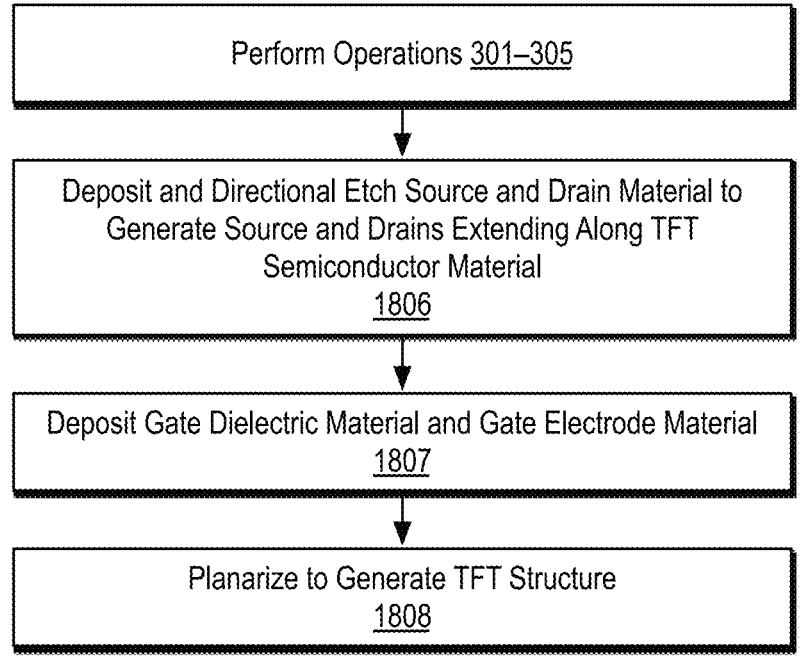
FIG. 18 illustrates a flow diagram illustrating an example process for fabricating thin film transistor structures.

FIG. 18 illustrates a flow diagram illustrating an example process 1800 for fabricating thin film transistor structures, arranged in accordance with at least some implementations of the present disclosure. For example, process 1800 may be implemented to fabricate thin film transistor structure 200 or any other thin film transistor structure discussed herein. In the illustrated implementation, process 1800 may include one or more operations as illustrated by operations 301-305 and 1806-1808. However, embodiments herein may include additional operations, certain operations being omitted, or operations being performed out of the order provided. In an embodiment, process 1800 may fabricate thin film transistor structure 2200 as discussed further herein with respect to FIGS. 4-13 and 19-22.

Process 1800 may begin at operations 301-305 as discussed with respect to FIG. 3 herein. That is, process 1800 may include operations 301-305. In an embodiment, operations 301-305 may be performed as illustrated with respect to FIGS. 4, 5, 6A, 6B, 7A, 7B, 8, 9, 10, 11, 12, and 13. Process 1800 may begin at operation 1806, where a conformal source and drain material layer may be deposited and directionally etched to form a source and a drain that each extend along sidewalls of the thin film transistor semiconductor material within the trench while exposing a surface of the thin film transistor semiconductor material within the trench. The source and drain material layer may be deposited using any suitable technique or techniques such CVD, PECVD, PVD, electroplating etc. Furthermore, the directional etch may be performed using any suitable technique or techniques such as dry etch techniques. In an embodiment, extended source and drains may be formed as discussed with respect to FIGS. 19 and 20.

Processing may continue at operation 1807, where a gate dielectric material may be conformally disposed over the exposed source and drain material and the exposed thin film transistor semiconductor material within the trench and a gate electrode material may be disposed over the gate dielectric material. The gate dielectric material may be disposed using any suitable technique or techniques such as CVD, PECVD, PVD, electroplating, etc. In an embodiment, the gate dielectric material and the gate electrode material may be disposed over the source and drain material, the sidewall spacer and the thin film transistor semiconductor material as discussed with respect to FIG. 21.

Processing may continue at operation 1808, where portions of the gate dielectric material and the gate electrode material may be removed to form a TFT structure. For example, the TFT structure may have a discrete gate electrode structure having an exposed surface (e.g., for contact by a via or other metallization) such that the other surfaces of the gate electrode structure have a gate dielectric layer thereon. The portions of the gate dielectric material and the gate electrode material may be removed using any suitable technique or techniques such as planarization techniques. In an embodiment, the portions of the gate dielectric material and the gate electrode material may be removed as discussed with respect to FIGS. 22A and 22B.

FIGS. 19, 20, 21, and 22A illustrate cross-sectional side views of example thin film transistor structures as particular fabrication operations are performed, arranged in accordance with at least some implementations of the present disclosure. FIG. 22B illustrates a top-down view of the thin film transistor structure of FIG. 22A.

Figure 19:
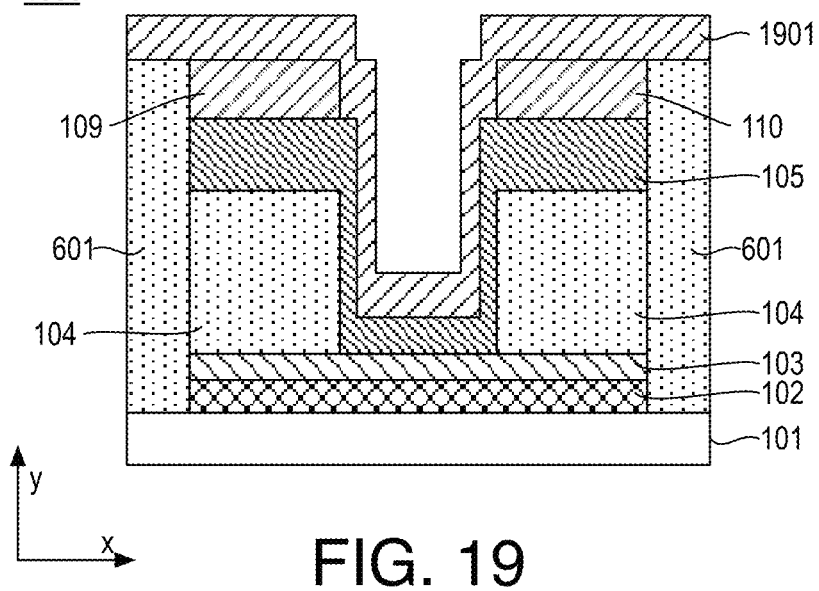
FIGS. 19, 20, 21, and 22A illustrate cross-sectional side views of example thin film transistor structures as particular fabrication operations are performed.

FIG. 19 illustrates a TFT structure 1900 similar to TFT structure 1300, after the formation of a conformal source and drain material layer 1901. Conformal source and drain material layer 1901 may include any material or materials discussed herein with respect to source 109, drain 110, source 209, and drain 210. Conformal dielectric layer 1401 may be formed using any suitable conformal deposition technique such as such as CVD, PECVD, PVD, electroplating, etc. As shown, conformal source and drain material layer 1901 is conformal to exposed surfaces of field insulator layer 601, source 109, drain 110, and non-planar semiconductor layer 105. In some embodiments, conformal source and drain material layer 1901 is the same material as source 109 and drain 110 and, in other embodiments, conformal source and drain material layer 1901 may have a different material.

Figure 20:
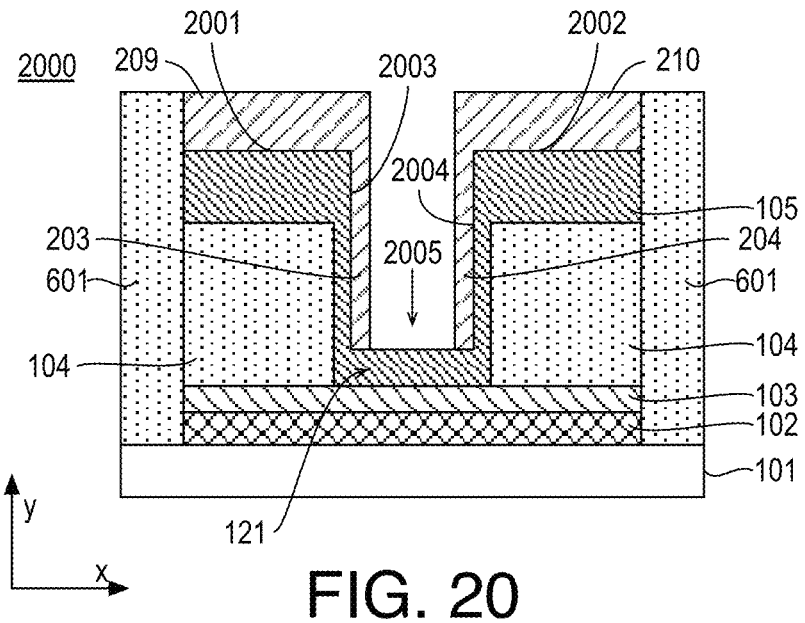

FIG. 20 illustrates a TFT structure 2000 similar to TFT structure 1900, after a directional etch of source and drain material layer 1901 to form source 209 and drain 210. The directional etch may be performed using any suitable technique or techniques such as dry etch techniques. For example, the directional etch may be a timed dry etch. Source 209 has a portion on a top surface 2001 of non-planar semiconductor layer 105 (as provided by source 109) and a portion on sidewall 2003 of non-planar semiconductor layer 105. Similarly, drain 210 has a portion on a top surface 2002 of non-planar semiconductor layer 105 (as provided by source 109) and a portion on sidewall 2004 of non-planar semiconductor layer 105. The portions on sidewalls 2003, 2004 extend to contact portion 121 of non-planar semiconductor layer 105. Furthermore, the directional etch exposes a top surface 2005 of portion 121 of non-planar semiconductor layer 105. For example, top surface 2005 may be exposed for the application of gate dielectric and gate electrode (e.g., a gate stack) while sidewalls 2003, 2004 may be coated with portions of source 209 and drain 210, respectively.

Figure 21:
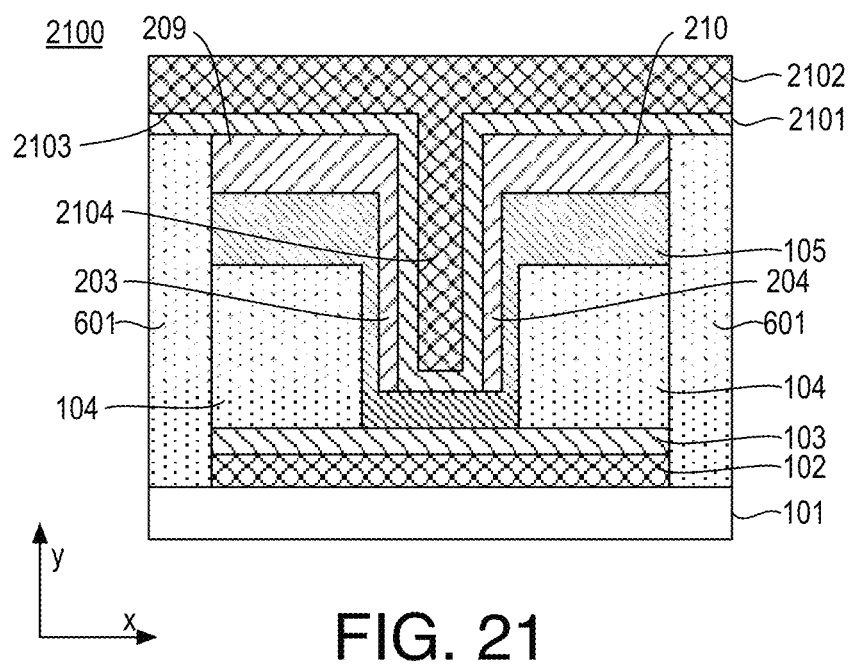

FIG. 21 illustrates a TFT structure 2100 similar to TFT structure 2000, after the formation of a gate dielectric layer 2101 and a gate electrode layer 2102. Gate dielectric layer 2101 may include any materials and characteristics discussed herein with respect to gate dielectric layer 107. Gate dielectric layer 2101 may be formed using any suitable technique or techniques such as CVD, PECVD, PVD, etc. As shown, gate dielectric layer 2101 may be formed conformally to exposed surfaces of field insulator layer 601, source 109, drain 110, sidewall spacer 106, and non-planar semiconductor layer 105 (e.g., the exposed surface of portion 121 of non-planar semiconductor layer 105). Furthermore, gate electrode layer 2102 may be formed over gate dielectric layer 2101 using any suitable technique or techniques such as CVD, PECVD, PVD, etc. Gate electrode material layer 2102 may include any suitable materials and characteristics as discussed with respect to gate electrode structure 108. As shown, gate electrode layer 2102 may fill a trench 2104 of gate dielectric layer 2101 as a fill and cover plateaus 2103 of gate dielectric layer 2101 extending laterally in the x-y plane. Furthermore, portion 2104 of gate electrode layer 2102 is within sidewall spacer 106 (e.g., between portions of sidewall spacer 106), between source 109 and drain 110, and within a trench of non-planar semiconductor layer 105.

Figure 22A:
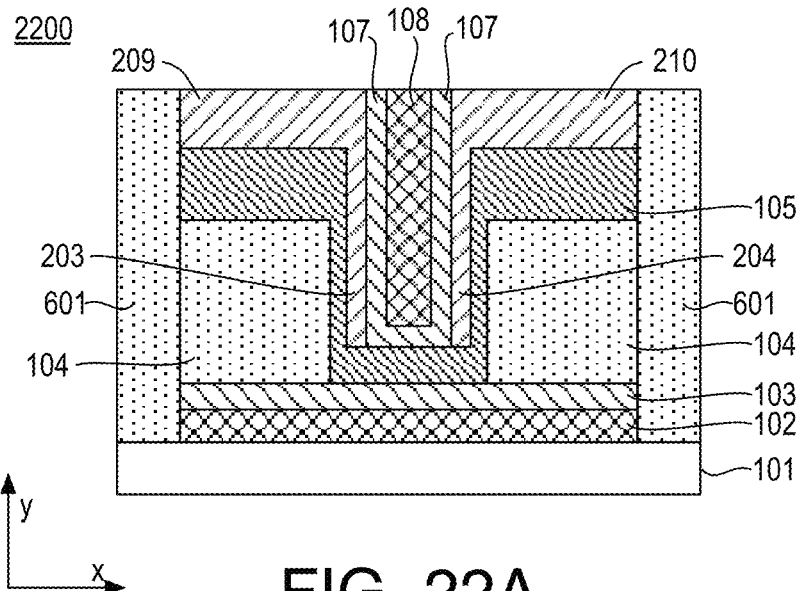
Figure 22B:
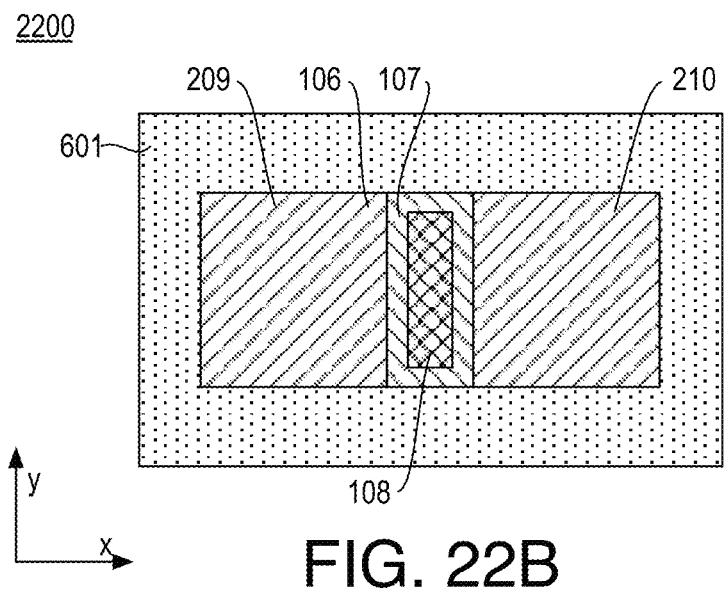
FIG. 22B illustrates a top-down view of the thin film transistor structure of FIG. 22A.

FIGS. 22A and 22B illustrates a TFT structure 2200 similar to TFT structure 2100, after the removal of portions of gate electrode layer 2102 and gate dielectric layer 2101 to form gate dielectric layer 107 and gate electrode structure 108. The portions of gate electrode layer 2102 and gate dielectric layer 2101 may be removed using any suitable technique or techniques such as planarization techniques. For example, TFT structure 2200 substantially matches TFT structure 200 and illustrates TFT structure 200 within field insulator layer 601. As shown in FIG. 22B, which provides a top-down view along the A-plane in FIG. 22A, gate electrode structure 102, gate dielectric layer 103, patterned layer 104, non-planar semiconductor layer 105, sidewall spacer 106, gate dielectric layer 107, gate electrode structure 108, source 109, and drain 110 may be isolated within field insulator layer 601. In the illustrated embodiment, a single TFT is within an opening of field insulator layer 601. In other embodiments multiple TFTs may be within an opening. For example, the multiple TFTs may share a common non-planar semiconductor layer 105.

Figure 23:
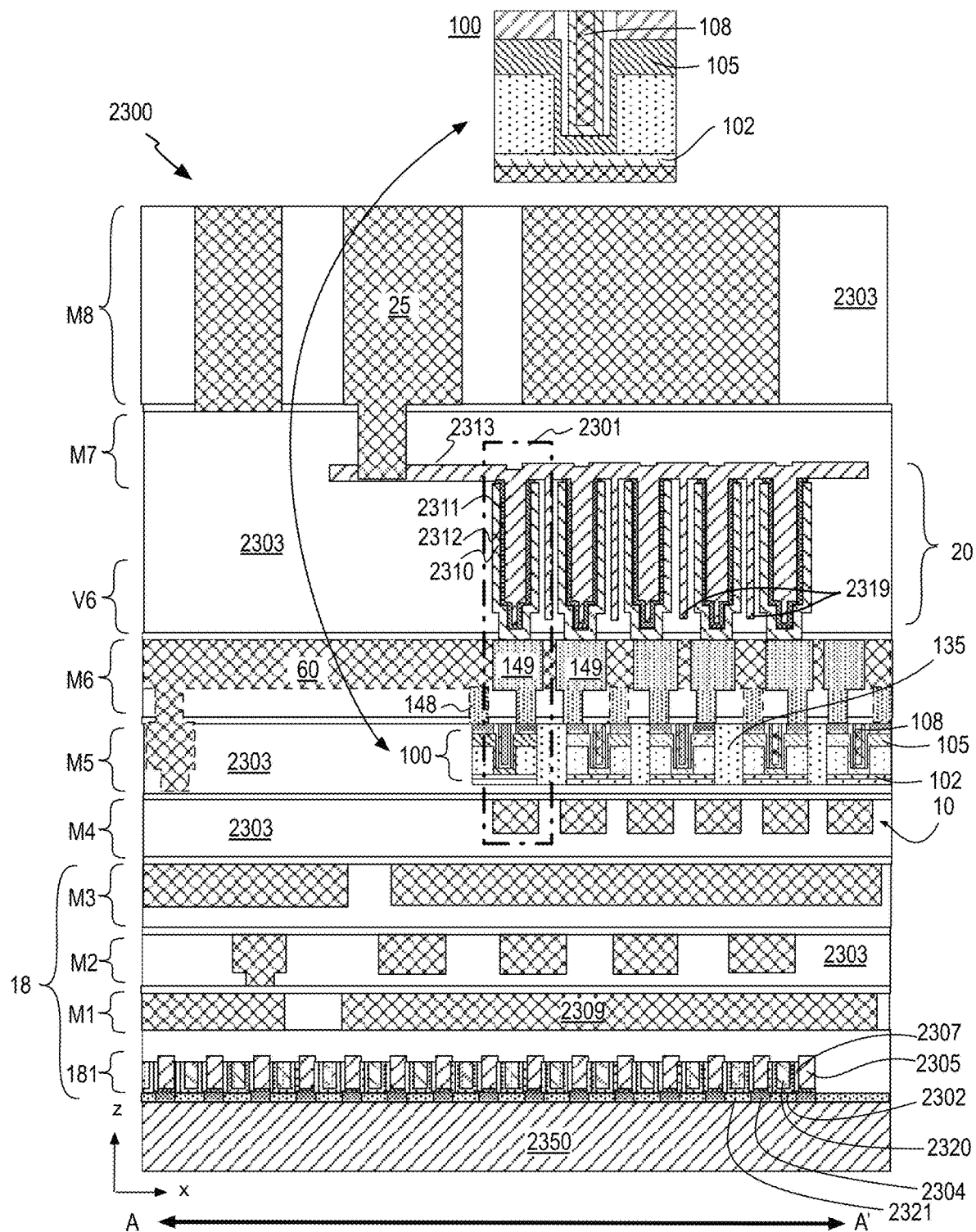
FIG. 23 illustrates a cross-sectional side view of a memory device structure.

FIG. 23 illustrates a cross-sectional side view of a memory device structure 2300, arranged in accordance with at least some implementations of the present disclosure. Memory device structure 2300 includes an exemplary implementation of a dual gate TFT structure. For example, memory device structure 2300 provides an implementation of an integrated circuit memory device employing a dual gate TFT structure. Although illustrated with respect to thin film transistor structures 100, memory device structure 2300 may implement thin film transistor structure 200, any other thin film transistor structure discussed herein, or combinations thereof. Such thin film transistor structures may be characterized as thin film transistors (TFTs). The cross-sectional view shown in FIG. 1 is along an A-A' line that passes through capacitors coupled to one bitline of a memory array. Memory device structure 2300 further illustrates a portion of an IC that includes peripheral circuitry 18 over and/or on a substrate 2350. Peripheral circuitry 18 includes a plurality of FETs 181 that employ a monocrystalline semiconductor for at least the channel semiconductor 2321. Peripheral circuitry 18 may further include one or more levels of interconnect metallization 2309 embedded within interlayer dielectric (ILD) materials 2303. ILDs 2303 may have any composition known to be suitable for electrical isolation of IC metallization, such as, but not limited to, materials including silicon and oxygen (SiO), materials including silicon and nitrogen (SiN), materials including silicon, oxygen, and nitrogen (SiON), low-k materials including a dopant (e.g., SiOF, SiOC), organosilicates, HSQ, MSQ, etc. In the exemplary embodiment illustrated, peripheral circuitry 18 includes metal-one (M1), metal-two (M2) and metal-three (M3) interconnect metallization levels.

Thin film transistor structures 100 are located over peripheral circuitry 18. As shown, one or more of thin film transistor structures 100 employ non-planar semiconductor layers 105, dual gates 102, 108 and other features discussed herein, which are not labeled for the sake of clarity of presentation. A memory cell 2301 is denoted by dot-dashed line. Individual ones of thin film transistor structures 100 are separated by field insulator layer 601 as discussed herein. Memory cell 2301 includes one storage capacitor of capacitor array 20. Such storage capacitors or portions thereof may be characterized as capacitor structures. One capacitor terminal that includes metal 2310 is electrically (e.g., conductively) coupled to a semiconductor terminal (e.g., source) of an individual one of thin film transistor structures 100. Individual ones of storage capacitor array 20 are similarly coupled to a terminal of corresponding individual ones of thin film transistor structures 100. In the illustrative embodiment, each of the storage capacitors in array 20 has another terminal including a metal portion 2311 connected in parallel through another metal portion 2313 routed to a shared circuit node 25. During memory device operation, circuit node 25 may be maintained at a reference voltage potential (e.g., ground). Individual ones of thin film transistor structures 100 have another semiconductor terminal (e.g., drain) electrically connected (e.g., conductively) to bitline metal 60. At least one gate electrode structure of thin film transistor structure 100 is connected to a respective wordline 10. For example, one or both of gate electrode structures 102, 108 (please refer to FIGS. 1A and 2A) are coupled to a respective wordline 10. Hence, memory cell 2301 and the illustrated adjacent memory cells are electrically coupled to one bitline metal 60 with their respective select thin film transistor structure 100 further coupled to separate wordlines 10. Memory cell 2301 may be replicated over any given bitline length. Wordlines 10 may be connected to corresponding wordline drivers (or a similar voltage source) operable to bias the wordlines between a voltage sufficient to turn off a select transistor and a voltage sufficient to turn on a select transistor. For example, wordlines 10 may be coupled to a wordline driver operable to bias the wordline between a negative voltage (e.g., between 0V and −0.5V) sufficient to turn off an n-type transistor, and a positive voltage (e.g., between 0.5V and 2V) sufficient to turn on an n-type transistor.

In some embodiments, bitline metal 60 comprises an interconnect metallization trace within a metallization level (e.g., M6) immediately above the metallization level (e.g., M5) in which thin film transistor structures 100 reside. Bitline 60 is illustrated in dashed line as an indication that bitline 60 is behind the plane of the cross-sectional view illustrated. Bitline 60 metallization trace is what might be visible if a portion of dielectric 103 flush with the plane of the cross-section was milled out (e.g., with a FIB during a deprocessing). As further shown, via 148 provides electrical connection between bitline 60 and semiconductor terminals (e.g., drains) of thin film transistor structures 100. Source terminals of thin film transistor structures 100 are electrically connected through local interconnect metallization 149. Local interconnect metallization 149 is within the same metallization level (e.g., M6) as bitline 60. Local interconnect metallization 149 is adjacent to, but electrically insulated, from bitline 60.

As discussed, local interconnect metallization 149 electrically interconnects a first storage capacitor terminal including metal 2310 with a source of thin film transistor structure 100. Capacitor metal portion 2311 is separated from capacitor metal 2310 by an intervening capacitor insulator 2312. Capacitor insulator 2312 may have any suitable relative permittivity (e.g., high-k such as $HfO_2$, doped high-k material such as Al or Zr doped $HfO_2$, etc.). In an embodiment, capacitor metal portion 2311 is continuous with routing metal portion 2313 across at least all capacitors 20 associated with bitline 60. Capacitor metal portion 2311 may also be continuous across capacitor array 20 associated multiple bitlines. Capacitor metal portion 2311 may therefore tie one side of all capacitors of a memory array to a common plate reference potential through circuit node 25, implemented for example with another metallization level (e.g., M8).

In some embodiments, an intervening metal shield 2319 separates laterally adjacent capacitors of capacitor array 20. Any number of interconnect metallization levels may be employed to route circuit nodes of the memory array to the underlying peripheral circuitry. In an embodiment, the capacitor reference potential at circuit node 25 is routed down through five metallization levels (e.g., M8-M3) to be in electrical communication with one or more control circuit employing FETs 181. Likewise, bitline 60 is routed down through three metallization levels (e.g., M6-M3) to be in electrical communication with one or more sense amplifier employing FETs 181. Wordlines 10 may also be routed down through one or more metallization levels (e.g., M4-M3) to be in electrical communication with one or more wordline driver employing FETs 181. As shown in FIG. 23, FETs 181 include a gate terminal 2320 separated from channel semiconductor 2321 by a gate dielectric 2302. Channel semiconductor 2321 separates semiconductor terminals 2304 (source semiconductor and drain semiconductor). Contact metallization 2305 lands on semiconductor terminals 2304 and is separated from gate terminal 2320 by an intervening dielectric spacer 2307. Any materials and techniques known to be suitable for fabricating FETs may be employed for forming FETs 181. FETs 181 may be planar or non-planar devices, for example. In some advantageous embodiments, FETS 181 are finFETs. One or more semiconductor materials may be employed in FETs 181. As one example, PETs 181 employ a surface layer of a substantially monocyrstalline substrate 2350. Substrate 2350 may be any material known to be suitable for the fabrication of MOSFET (CMOS) circuitry, such as, but not limited to, group IV materials (e.g., silicon, germanium, and SiGe).

Figure 24:
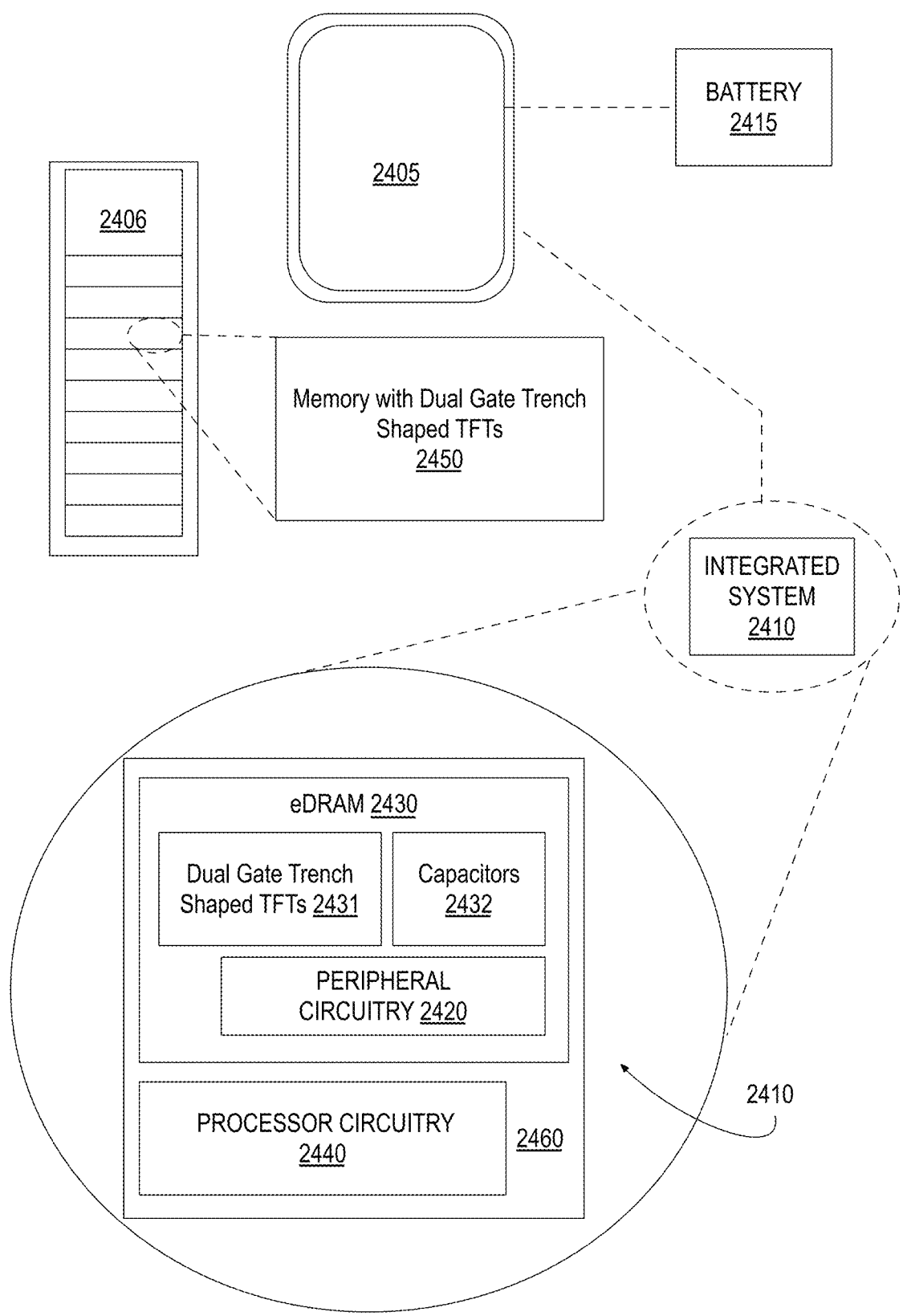
FIG. 24 illustrates a mobile computing platform and a data server machine employing memory devices including dual gate trench shaped thin film transistors.

FIG. 24 illustrates a mobile computing platform and a data server machine employing memory devices including dual gate trench shaped thin film transistors, arranged in accordance with at least some implementations of the present disclosure. For example, memory device 2450 of server machine 2406 may employ thin film transistor structure 100, thin film transistor structure 200, any other thin film transistor structure discussed herein, or combinations thereof. Server machine 2406 may be any commercial server, for example including any number of high-performance computing platforms disposed within a rack and networked together for electronic data processing, which in the exemplary embodiment includes a packaged monolithic or IC-eDRAM device including dual gate trench shaped thin film transistors. The mobile computing platform 2405 may be any portable device configured for each of electronic data display, electronic data processing, wireless electronic data transmission, or the like. For example, the mobile computing platform 2405 may be any of a tablet, a smart phone, laptop computer, etc., and may include a display screen (e.g., a capacitive, inductive, resistive, or optical touchscreen), a chip-level or package-level integrated system 2410, and a battery 2415.

Disposed within the integrated system 2410, a substrate 2460 includes an eDRAM 2430 and processor circuitry 2440 (e.g., a microprocessor, a multi-core microprocessor, graphics processor, or the like). eDRAM 2430 includes 1C-1TFT cells, with each cell including a dual gate trench shaped TFT 2431 (e.g., thin film transistor structure 100, thin film transistor structure 200, any other thin film transistor structure discussed herein) and a capacitor 2432 as well as peripheral circuitry 2420 (e.g., peripheral circuitry 18), for example as described elsewhere herein and, in particular, with respect to FIG. 23. For monolithic embodiments, substrate 2460 is a semiconductor chip. For multi-chip module embodiments, substrate 2460 may be any package substrate, or an interposer. Processor circuitry 2440, or a separate RFIC chip, may be further coupled to an antenna (not shown) to implement any of a number of wireless standards or protocols, including but not limited to Wi-Fi (IEEE 2402.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 25:
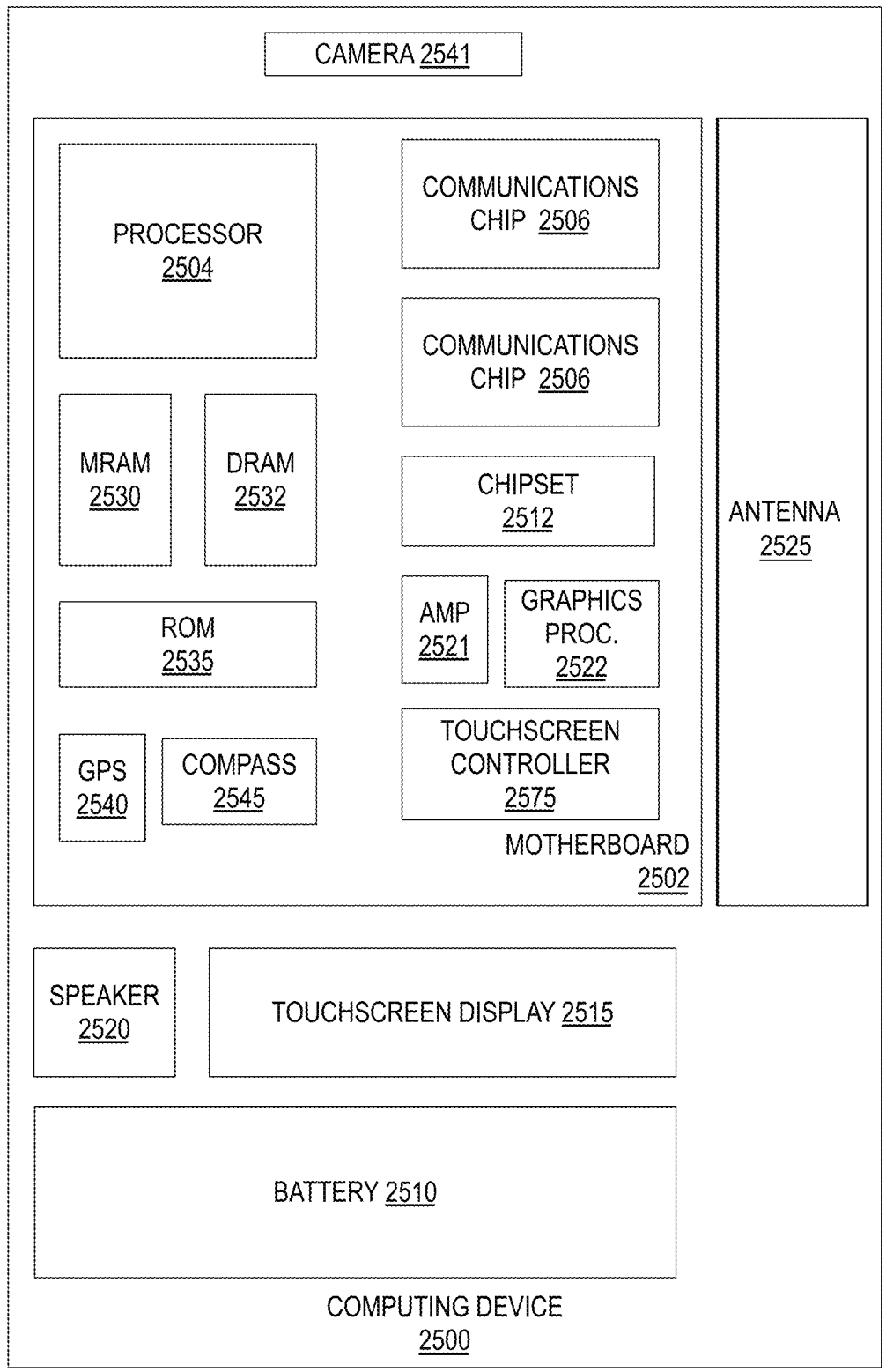
FIG. 25 is a functional block diagram of an electronic computing device, all arranged in accordance with at least some implementations of the present disclosure.

FIG. 25 is a functional block diagram of an electronic computing device 2500, arranged in accordance with at least some implementations of the present disclosure. Electronic computing device 2500 may employ a dual gate trench shaped TFT as discussed herein. Computing device 2500 may be found inside platform 2405 or server machine 2406, for example. Device 2500 further includes a motherboard 2502 hosting a number of components, such as, but not limited to, a processor 2504 (e.g., an applications processor), which may further incorporate interconnect structures (e.g., line segments with compositional variation) in accordance with embodiments described herein. Processor 2504 may be physically and/or electrically coupled to motherboard 2502. In some examples, processor 2504 includes an integrated circuit die packaged within the processor 2504. In general, the term "processor" or "microprocessor" may refer to any device or portion of a device that processes electronic data from registers and/or memory to transform that electronic data into other electronic data that may be further stored in registers and/or memory.

In various examples, one or more communication chips 2506 may also be physically and/or electrically coupled to the motherboard 2502. In further implementations, communication chips 2506 may be part of processor 2504. Depending on its applications, computing device 2500 may include other components that may or may not be physically and electrically coupled to motherboard 2502. These other components include, but are not limited to, volatile memory (e.g., MRAM 2530, DRAM 2532), non-volatile memory (e.g., ROM 2535), flash memory, a graphics processor 2522, a digital signal processor, a crypto processor, a chipset 2512, an antenna 2525, touchscreen display 2515, touchscreen controller 2575, battery 2510, audio codec, video codec, power amplifier 2521, global positioning system (GPS) device 2540, compass 2545, accelerometer, gyroscope, audio speaker 2520, camera 2541, and mass storage device (such as hard disk drive, solid-state drive (SSD), compact disk (CD), digital versatile disk (DVD), and so forth), or the like.

Communication chips 2506 may enable wireless communications for the transfer of data to and from the computing device 2500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2506 may implement any of a number of wireless standards or protocols, including but not limited to those described elsewhere herein. As discussed, computing device 2500 may include a plurality of communication chips 2506. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A method of fabricating a thin film transistor structure, comprising:
    forming a trench extending through a source and drain material layer, a first semiconductor layer, and a dielectric layer to expose a surface of a first gate dielectric layer, wherein the first gate dielectric layer is over a first gate electrode;
    growing a second semiconductor layer from the first semiconductor layer and over the dielectric layer and the surface of the first gate dielectric layer to form a non-planar semiconductor layer having a portion over the surface of the first gate dielectric layer;
    disposing a second gate dielectric layer over the portion of the non-planar semiconductor layer; and
    disposing a second gate electrode at least partially within the trench, wherein the second gate dielectric layer is between the portion of the non-planar semiconductor layer and the second gate electrode.

2. The method of claim 1, wherein the second gate dielectric layer comprises a portion that extends along a sidewall of the second gate electrode within the trench.

3. The method of claim 1, further comprising:
    disposing a dielectric spacer on a sidewall portion of the non-planar semiconductor layer, wherein disposing the second gate dielectric layer comprises disposing the second gate dielectric layer on at least a sidewall of the dielectric spacer.

4. The method of claim 1, further comprising:
    disposing a second source and drain material layer on a sidewall portion of the non-planar semiconductor layer and the portion of the non-planar semiconductor layer; and
    removing at least a portion of the second source and drain material layer to expose the portion of the non-planar semiconductor layer, wherein disposing the second gate dielectric layer comprises disposing the second gate dielectric layer on at least a sidewall of the second source and drain material layer.

5. The method of claim 1, wherein growing the second semiconductor layer from the first semiconductor layer comprises growing a portion of the second semiconductor layer over at least a portion of an exposed surface of the source and drain material layer, the method further comprising:
    providing a bulk material over the first and second semiconductor layers;
    performing a recess etch to remove the portion of the second semiconductor layer over the exposed surface of the source and drain material layer; and
    removing remaining portions of the bulk material.

6. The method of claim 1, wherein the non-planar semiconductor layer comprises an amorphous or polycrystalline semiconductor material.

7. The method of claim 1, wherein the first and second gate electrodes comprise different materials.

8. A method of fabricating a thin film transistor structure, comprising:
    forming a trench extending through a metal layer, a first semiconductor layer, and a dielectric layer to expose a surface of a first gate dielectric layer, wherein the first gate dielectric layer is over a first gate electrode;
    growing a second semiconductor layer from the first semiconductor layer and over the dielectric layer and the surface of the first gate dielectric layer to form a non-planar semiconductor layer having a portion over the surface of the first gate dielectric layer;
    disposing a second gate dielectric layer over the portion of the non-planar semiconductor layer; and
    disposing a second gate electrode at least partially within the trench, wherein the second gate dielectric layer is between the portion of the non-planar semiconductor layer and the second gate electrode.

9. The method of claim 8, wherein the second gate dielectric layer comprises a portion that extends along a sidewall of the second gate electrode within the trench.

10. The method of claim 8, further comprising:
    disposing a dielectric spacer on a sidewall portion of the non-planar semiconductor layer, wherein disposing the second gate dielectric layer comprises disposing the second gate dielectric layer on at least a sidewall of the dielectric spacer.

11. The method of claim 8, further comprising:
    disposing a second metal layer on a sidewall portion of the non-planar semiconductor layer and the portion of the non-planar semiconductor layer; and
    removing at least a portion of the second metal layer to expose the portion of the non-planar semiconductor layer, wherein disposing the second gate dielectric layer comprises disposing the second gate dielectric layer on at least a sidewall of the second metal layer.

12. The method of claim 8, wherein growing the second semiconductor layer from the first semiconductor layer comprises growing a portion of the second semiconductor layer over at least a portion of an exposed surface of the metal layer, the method further comprising:
    providing a bulk material over the first and second semiconductor layers;
    performing a recess etch to remove the portion of the second semiconductor layer over the exposed surface of the metal layer; and
    removing remaining portions of the bulk material.

13. The method of claim 8, wherein the non-planar semiconductor layer comprises an amorphous or polycrystalline semiconductor material.

14. The method of claim 8, wherein the first and second gate electrodes comprise different materials.

15. A method of fabricating a thin film transistor structure comprising:
    forming a trench extending through a source and drain material layer, a first thin film semiconductor layer, and a dielectric layer to expose a surface of a first gate dielectric layer, wherein the first gate dielectric layer is over a first gate electrode structure;
    growing a second thin film semiconductor layer from the first thin film semiconductor layer and over the dielectric layer and the surface of the first gate dielectric layer to form a non-planar thin film semiconductor layer having a portion over the surface of the first gate dielectric layer;

disposing a second gate dielectric layer over the portion of the non-planar thin film semiconductor layer; and disposing a second gate electrode structure at least partially within the trench, wherein the second gate dielectric layer is between the portion of the non-planar thin film semiconductor layer and the second gate electrode structure.

16. The method of claim 15, wherein the second gate dielectric layer comprises a portion that extends along a sidewall of the second gate electrode structure within the trench.

17. The method of claim 15, further comprising:
disposing a dielectric spacer layer on a sidewall portion of the non-planar thin film semiconductor layer, wherein disposing the second gate dielectric layer comprises disposing the second gate dielectric layer on at least a sidewall of the dielectric spacer layer.

18. The method of claim 15, further comprising:
disposing a second source and drain material layer on a sidewall portion of the non-planar thin film semiconductor layer and the portion of the non-planar thin film semiconductor layer; and removing at least a portion of the second source and drain material layer to expose the portion of the non-planar thin film semiconductor layer, wherein disposing the second gate dielectric layer comprises disposing the second gate dielectric layer on at least a sidewall of the second source and drain material layer.

19. The method of claim 15, wherein growing the second thin film semiconductor layer from the first thin film semiconductor layer comprises growing a portion of the second thin film semiconductor layer over at least a portion of an exposed surface of the source and drain material layer, the method further comprising:

providing a bulk material over the first and second thin film semiconductor layers;

performing a recess etch to remove the portion of the second thin film semiconductor layer over the exposed surface of the source and drain material layer; and removing remaining portions of the bulk material.

20. The method of claim 15, wherein the non-planar thin film semiconductor layer comprises an amorphous or polycrystalline semiconductor material.

* * * * *